US008395696B2

(12) United States Patent
Ng et al.

(10) Patent No.: US 8,395,696 B2
(45) Date of Patent: Mar. 12, 2013

(54) IMAGING ARRANGEMENTS AND METHODS THEREFOR

(75) Inventors: Yi-Ren Ng, Mountain View, CA (US); Patrick M. Hanrahan, Portola Valley, CA (US); Marc A. Levoy, Stanford, CA (US); Mark A. Horowitz, Menlo Park, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 158 days.

(21) Appl. No.: 13/078,894

(22) Filed: Apr. 1, 2011

(65) Prior Publication Data
US 2012/0019711 A1 Jan. 26, 2012

Related U.S. Application Data

(62) Division of application No. 11/576,438, filed as application No. PCT/US2005/035189 on Sep. 30, 2005, now Pat. No. 7,936,392.

(60) Provisional application No. 60/615,179, filed on Oct. 1, 2004, provisional application No. 60/647,492, filed on Jan. 27, 2005.

(51) Int. Cl.
*G03B 13/00* (2006.01)
*H04N 5/232* (2006.01)

(52) U.S. Cl. .................................. 348/349; 348/350

(58) Field of Classification Search .................. 348/349, 348/350
See application file for complete search history.

(56) References Cited

U.S. PATENT DOCUMENTS

| 725,567 A | 4/1903 | Ives |
| 3,971,065 A | 7/1976 | Bayer |
| 3,985,419 A | 10/1976 | Matsumoto et al. |
| 4,383,170 A | 5/1983 | Takagi |
| 4,448,497 A | 5/1984 | Wakamiya |
| 4,661,986 A | 4/1987 | Adelson |
| 4,694,185 A | 9/1987 | Weiss |
| 5,076,687 A | 12/1991 | Adelson |
| 5,282,045 A | 1/1994 | Mimura |
| 5,610,390 A | 3/1997 | Miyano |
| 5,629,734 A | 5/1997 | Hamilton, Jr. |
| 5,748,371 A | 5/1998 | Cathey |
| 5,757,423 A | 5/1998 | Tanaka |
| 6,023,523 A | 2/2000 | Cohen |
| 6,028,606 A | 2/2000 | Kolb |

(Continued)

FOREIGN PATENT DOCUMENTS

| DE | 19624421 A1 | 6/1996 |
| EP | 0821532 A1 | 1/1998 |

(Continued)

OTHER PUBLICATIONS

J. Jackson et al. "Selection of a Convolution Function for Fourier Inversion Using Gridding." IEEE Transactions on Medical Imaging. Sep. 1991 vol. 10, No. 3, pp. 473-478.

(Continued)

*Primary Examiner* — Anthony J Daniels
(74) *Attorney, Agent, or Firm* — Courtney IP Law; Barbara B. Courtney

(57) ABSTRACT

Image data is processed to facilitate focusing and/or optical correction. According to an example embodiment of the present invention, an imaging arrangement collects light data corresponding to light passing through a particular focal plane. The light data is collected using an approach that facilitates the determination of the direction from which various portions of the light incident upon a portion of the focal plane emanate from. Using this directional information in connection with value of the light as detected by photosensors, an image represented by the light is selectively focused and/or corrected.

25 Claims, 35 Drawing Sheets

U.S. PATENT DOCUMENTS

| | | | |
|---|---|---|---|
| 6,028,608 | A | 2/2000 | Jenkins |
| 6,097,394 | A | 8/2000 | Levoy |
| 6,201,899 | B1 | 3/2001 | Bergen |
| 6,320,979 | B1 | 11/2001 | Melen |
| 6,483,535 | B1 | 11/2002 | Tamburrino |
| 6,577,342 | B1 | 6/2003 | Wester |
| 6,842,297 | B2 | 1/2005 | Dowski |
| 7,034,866 | B1 * | 4/2006 | Colmenarez et al. .... 348/211.12 |
| 7,119,319 | B2 | 10/2006 | Noto |
| 7,164,446 | B2 | 1/2007 | Konishi |
| 7,167,203 | B1 | 1/2007 | Yukawa |
| 7,367,537 | B2 | 5/2008 | Ibe |
| 7,623,726 | B1 | 11/2009 | Georgiev |
| 2002/0114077 | A1 | 8/2002 | Javidi |
| 2002/0114078 | A1 | 8/2002 | Halle |
| 2002/0159030 | A1 | 10/2002 | Frey |
| 2003/0117511 | A1 | 6/2003 | Belz |
| 2003/0156077 | A1 | 8/2003 | Balogh |
| 2005/0080602 | A1 | 4/2005 | Snyder |
| 2006/0033005 | A1 | 2/2006 | Jerdev |
| 2006/0072029 | A1 | 4/2006 | Miyatake |
| 2006/0101080 | A1 | 5/2006 | Atsumi |
| 2007/0030379 | A1 | 2/2007 | Agranov |
| 2008/0043117 | A1 | 2/2008 | Kim |
| 2008/0303920 | A1 | 12/2008 | Kinoshita |
| 2009/0102956 | A1 | 4/2009 | Georgiev |
| 2009/0185801 | A1 | 7/2009 | Georgiev |
| 2009/0295829 | A1 | 12/2009 | Georgiev |

FOREIGN PATENT DOCUMENTS

| | | |
|---|---|---|
| JP | 2002 051358 A | 2/2002 |
| WO | 00/22566 | 4/2000 |
| WO | 00 22566 A1 | 4/2000 |
| WO | 00/68890 A1 | 11/2000 |
| WO | 2006/039486 A3 | 4/2006 |
| WO | 2007/003420 | 2/2007 |

OTHER PUBLICATIONS

T. Naemura et al. "3-D Computer Graphics based on Integral Photography." Optics Express, Feb. 12, 2001. vol. 8, No. 2, pp. 255-262.

F. Okano et al. "Three-dimendional video system based on integral photography." Optical Engineering Jun. 1999. vol. 38, No. 6, pp. 1072-1077.

E. Adleson et al. "Single Lens Stereo with a Plenoptic Camera." IEEE Translation on Pattern Analysis and Machine Intelligence, Feb. 1992. vol. 14, No. 2, pp. 99-106.

M. Levoy et al. "Light Field Rendering." SIGGRAPH 96 Proceeding, 1996. pp. 31-42.

A. Isaksen et al. "Dynamically Reparameterized Light Fields." SIGGRAPH 2000, Computer Graphics Proceedings. 10 pgs.

A. Agarwala et al. "Interactive Digital Montage," ACM SIGGRAPH 2004, vol. 23, No. 3m pp. 292-300.

P. Haeberli. "A Multifocus Method for Controlling Depth of Field." GRAPHICAObscura, 1994, pp. 1-3.

Edward H. Adelson and John Y.A. Wang, "Single Lens Stereo with a Plenoptic Camera," Feb. 1992, IEEE, vol. 14, No. 2, pp. 99-106.

Paul Haeberli, "A Multifocus Method for Controlling Depth of Field," Oct. 1994, http://grafficaobscura.com/depth/index.html.

Fitzpatrick, Brad, "Camlistore", Feb. 1, 2011, pp. 1-27. Retrieved from http://camlistore.org/.

Dowski et al., "Wavefront coding: a modern method of achieving high performance and/or low cost imaging systems" SPIE Proceedings, vol. 3779.

Georgiev, T., et al., "Spatio-Angular Resolution Tradeoff in Integral Photography," Proceedings of Eurographics, Symposium on Rendering, 2006.

Levoy, "Light Fields and Computational Imaging" IEEE Computer Society, Aug. 2006, pp. 46-55.

Lumsdaine et al., "Full Resolution Lightfield Rendering" Adobe Technical Report Jan. 2008, pp. 1-12.

Ng, R., et al. "Light Field Photography with a Hand-Held Plenoptic Camera," Stanford Technical Report, CSTR 2005-2, 2005.

Ng, R., "Digital Light Field Photography," Dissertation, Department of Computer Science, Stanford University, Jun. 2006.

Ng., R., "Fourier Slice Photography," ACM Transactions on Graphics, Proceedings of SIGGRAPH 2005, vol. 24, No. 3, 2005, pp. 735-744.

Okano et al., "Three-dimensional video system based on integral photography" Optical Engineering, Jun. 1999. vol. 38, No. 6, pp. 1072-1077.

Vaish, V., et al., "Synthetic Aperture Focusing Using a Shear-Warp Factorization of the Viewing Transform," Workshop on Advanced 3D Imaging for Safety and Security (in conjunction with CVPR 2005), 2005.

Adobe Systems Incorporated, "XMP Specification", pp. 1-112, Sep. 2005.

Askey, P., 2005. Digital cameras timeline: 2005. Digital-Photography Review, http:/lwww.dpreview.com/reviews/timeline.asp?s-= 2005.

Debevec, P. E., and Malik, J. 1997. Recovering high dynamic range radiance maps from photographs. In SIGGRAPH 97, 369-378.

Dowski, E. R, and Johnson, G. E. 1999. Wavefront coding: A modem method of achieving high performance and/ or low cost imaging systems. In SPIE Proceedings, vol. 3779.

Durand, F., Holzschuch, N., Soler, C., Chan, E., and Sillion, F. 2005. A frequency analysis oflight transport. A CM Transactions on Graphics (Proceedings of SIGGRAPH 2005) 24, 3, 1115-1126.

Haro, L. D. S. 2000. Wavefront Sensing in the Human Eye with a Shack-Haifmann Sensor. PhD thesis, University of London.

Mitchell, D. P., and Netra V Ali, A. N. 1998. Reconstruction filters in computer graphics. In SIGGRAPH 98, 221-228.

Nayar, S., and Mitsunaga, T. 2000. High Dynamic Range Imaging: Spatially Varying Pixel Exposures. In IEEE Conference on Computer Vision and Pattern Recognition (CVPR), vol. 1, 472-479.

Stewart, J., Yu, J., Gortler, S.J., and McMillan, L. 2003. A new reconstruction filter for undersampled light fields. In Proceedings of the £urographies Symposium on Rendering 2003, 150-156.

European Patent Office, Extended EPO Search Report in RE/110553DIV.1, App. 11180444.9, Nov. 22, 2011.

European Patent Office, Extended EPO Search Report in RE/110554DIV.2, App. 1117985.5, Nov. 21, 2011.

Herbert E. Ives, "Optical properties of a Lippman lenticulated sheet," J. Opt. Soc. Am. 21, 171 (1931).

Vaish et al., "Using plane + parallax for calibrating dense camera arrays", In Proceedings CVPR, 2004, pp. 2-9.

Wilburn et al., "High Performance Imaging using Large Camera Arrays", ACM Transactions on Graphics (TOG), vol. 24, Issue 3 (Jul. 2005), Proceedings of ACM SIGGRAPH 2005, pp. 7.

Jin-Xiang Chai et al., "Plenoptic Sampling", ACM SIGGRAPH 2000, Annual Conference Series, 2000, pp. 307-318.

Dowski et al., "Wavefront coding: A modern method of achieving high performance and/or low cost imaging systems" SPIE Proc. vol. 3779 (1999).

Tanida et al., "Thin observation module by bound optics (TOMBO): concept and experimental verification" Applied Optics 40, 11 (Apr. 2001), pp. 1806-1813.

Lippmann, "Reversible Prints", Communication at the French Society of Physics, Journal of Physics, 7, 4, Mar. 1908, pp. 821-825.

Sokolov, "Autostereoscopy and Integral Photography by Professor Lippmann's Method", 1911, pp. 23-29.

Gortler et al., "The lumigraph" SIGGRAPH 96, pp. 43-54 (1996).

* cited by examiner

 
Closup
FIG. 14A
 
Closup
FIG. 14B
 
Closup
FIG. 14C

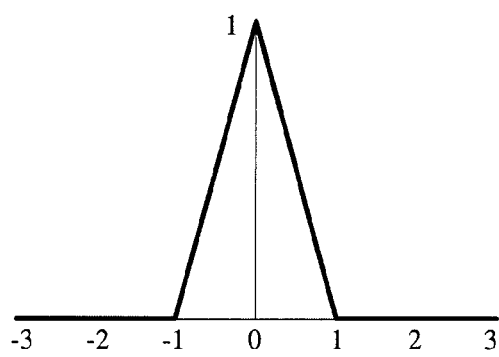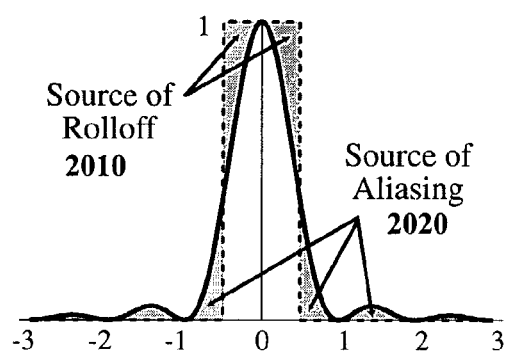
FIG. 21A  FIG. 21B

Virtual film 2560

IMAGING ARRANGEMENTS AND METHODS THEREFOR

RELATED PATENT DOCUMENTS

This patent application is a divisional application claiming benefit of U.S. patent application Ser. No. 11/576,438, filed Jun. 6, 2007, now U.S. Pat. No. 7,936,392 under 35 U.S.C. §371, which is a national stage application from PCT/US2005/035189, filed Sep. 30, 2005, which claims the benefit, under 35 U.S.C. §119(e) of U.S. Provisional Patent Application Ser. No. 60/615,179 filed on Oct. 1, 2004, and of U.S. Provisional Patent Application Ser. No. 60/647,492 filed on Jan. 27, 2005. All of the foregoing applications are fully incorporated herein by reference.

GOVERNMENT LICENSE RIGHTS

This invention was made with government support under contract 0085864 awarded by the National Science Foundation. The government has certain rights in the invention.

FIELD OF THE INVENTION

The present invention relates generally to imaging applications, and more specifically to processing image data to focus and/or correct the image data.

BACKGROUND

Imaging applications such as those involving cameras, video cameras, microscopes, telescopes and more have generally been limited in the amount of light that is collected. That is, most imaging devices do not record most of the information about light distribution entering the device. For example, conventional cameras such as digital still cameras and video cameras do not record most of the information about the light distribution entering from the world. In these devices, collected light is often not amenable to manipulation for a variety of approaches, such as for focusing at different depths (distances from the imaging device), correcting for lens aberrations or manipulating an angle of view.

For still-imaging applications, typical imaging devices capturing a particular scene generally focus upon a subject or object in the scene, with other parts of the scene left out of focus. For video-imaging applications, similar problems prevail, with a collection of images used in video applications failing to capture scenes in focus.

Many imaging applications suffer from aberrations with the equipment (lenses) used to collect light. Such aberrations may include, for example, spherical aberration, chromatic aberration, distortion, curvature of the light field, oblique astigmatism and coma. Correction for aberrations has typically involved the use of corrective optics, when tend to add bulk, expense and weight to imaging devices. In some applications benefiting from small-scale optics, such as camera phones and security cameras, the physical limitations associated with the applications make it undesirable to include additional optics.

Difficulties associated with the above have presented challenges to imaging applications, including those involving the acquisition and altering of digital images.

SUMMARY

The present invention is directed to overcoming the above-mentioned challenges and others related to imaging devices and their implementations. The present invention is exemplified in a number of implementations and applications, some of which are summarized below.

According to an example embodiment of the present invention, a light is detected with directional information characterizing the detected light. The directional information is used with the detected light to generate a virtual image, corresponding to one or both of a refocused image and a corrected image.

According to another example embodiment of the present invention, two or more subjects at different focal depths in a scene are imaged, with portions of the scene corresponding to each subject focused at different focal planes. Light from the scene is focused upon a physical focal plane and detected, together with information characterizing the direction from which the light arrived at particular locations on the physical focal plane. For at least one subject that is located at a depth of field that is not focused upon the physical focal plane, a virtual focal plane that is different than the physical focal plane is determined. Using the detected light and directional characteristics thereof, portions of the light corresponding to a focused image of the at least one subject upon the virtual focal plane are collected and added to form a virtual focused image of the at least one subject.

According to another example embodiment of the present invention, a scene is digitally imaged. Light from the scene that is passed to different locations on a focal plane is detected, and the angle of incidence of the light detected at the different locations on the focal plane is detected. A depth of field of a portion of the scene from which the detected light came is detected and used together with the determined angle of incidence to digitally re-sort the detected light. Depending upon the application, the re-sorting includes refocusing and/or correcting for lens aberrations.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention that follows in connection with the accompanying drawings, in which:

FIGS. 14A-14C show an approach to computing images with different depths of field, according to another example embodiment of the present invention;

FIG. 21A shows a triangle filter approach, according to another example embodiment of the present invention;

FIG. 21B shows a Fourier transformation of the triangle filter approach; according to another example embodiment of the present invention;

Figure 1:
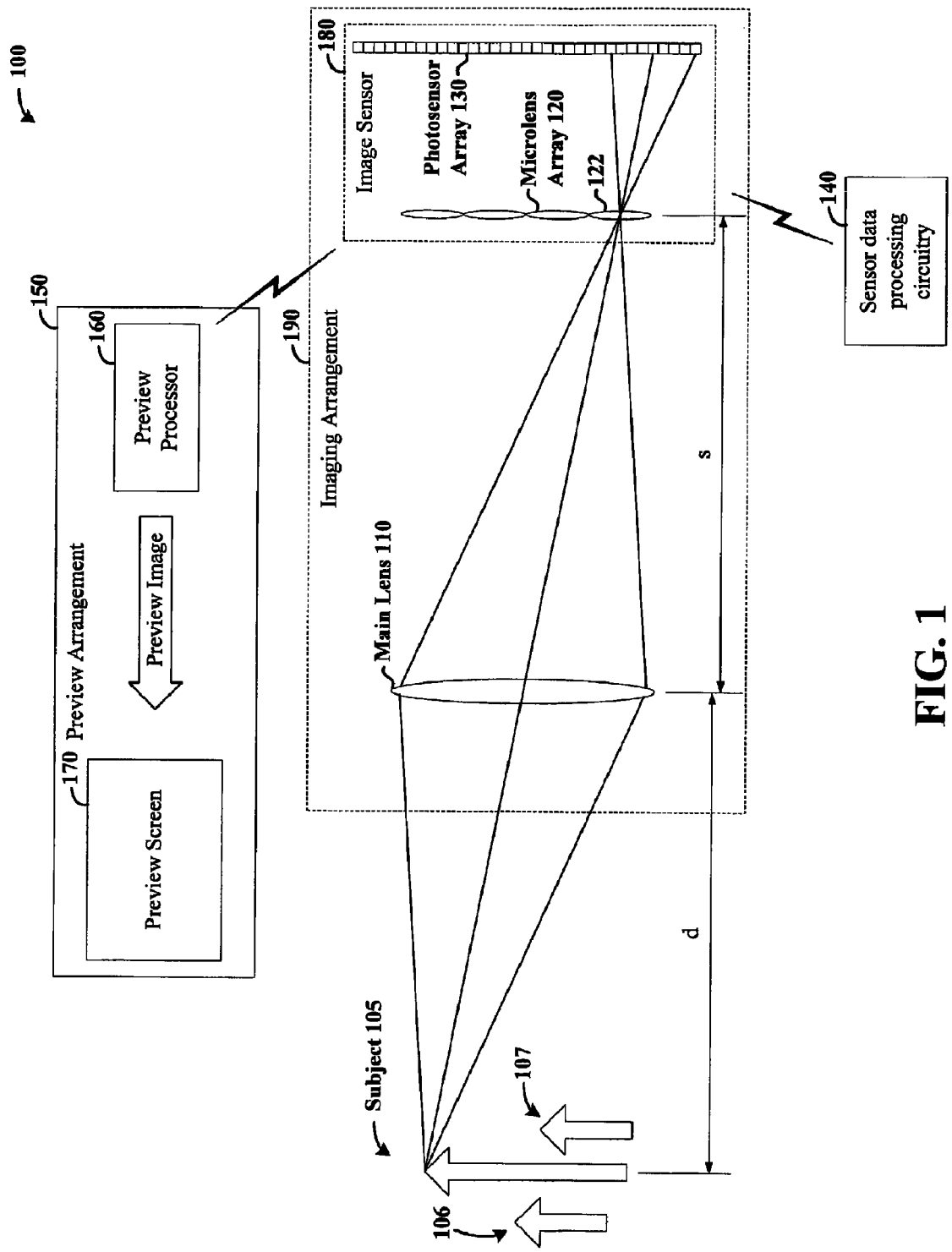
FIG. 1 is a light ray capturing and processing arrangement, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present invention is believed to be useful for a variety of different types of devices, and the invention has been found to be particularly suited for electronic imaging devices and applications. While the present invention is not necessarily limited to such applications, various aspects of the invention may be appreciated through a discussion of various examples using this context.

According to an example embodiment of the present invention, a four-dimensional (4D) light field (e.g., the light traveling along each ray in a region such as free space) is detected using an approach involving the determination of the amount and direction of light arriving at a sensor located at a focal plane. The two-dimensional position of light in the focal plane is detected, together with information characterizing the direction from which the light arrived at particular locations in the plane. With this approach, the directional lighting distribution arriving at different locations on the sensor are determined and used to form an image. In various discussions herein, the assembly or assemblies implemented for sensing and/or measuring of a light field are referred to as a "light ray sensor," or a "ray sensor."

In one application, an approach similar to the above is implemented using an imaging system having optics and sensors that sample the space of light rays that are incident on an imaging plane, with computational functionality that renders images from the set of measured rays in different ways. Each of the optics, sensors and computational functionality is implemented using a variety of approaches, in combination or distinctly, depending upon the implementation. For example, a camera having lenses (optics) that focus an image upon a photosensor array (sensors) located at an imaging plane can be used to sample the space of light rays. An output from the photosensor array is used with computational functions (e.g., at a processor internal and/or external to the camera) to render images, such as by computing photographs that are focused at different depths or with different depths of field, and/or computationally correcting lens aberrations to produce higher quality images.

In another example embodiment, optics and sensor components of an imaging system direct rays of light onto sensor elements such that each sensor element senses a set of rays including rays emanating from specific directions. In many applications, this set of rays is a bundle of rays that is localized in both space and direction. For many applications, this bundle of rays will converge to a single geometric ray of light as the optics and sensor resolutions increase. In this regard, various portions of the description herein refer to the values sensed by the sensor elements as "rays of light" or "light rays" or simply "rays," even though in general they may not be limited to geometric rays.

Figure 28:
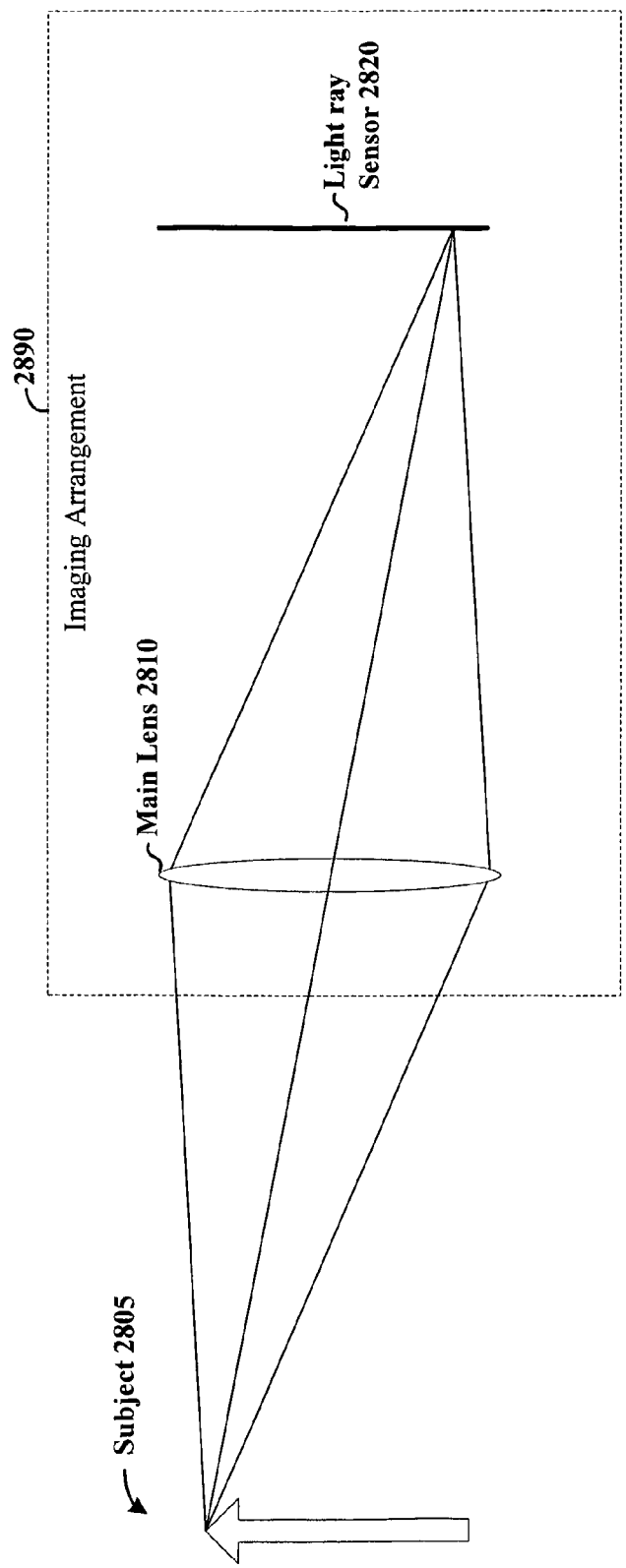
FIG. 28 shows an imaging arrangement; according to another example embodiment of the present invention.

Turning now to the figures, FIG. 28 shows an imaging arrangement 2890, according to another example embodiment of the present invention. The imaging arrangement 2890 includes a main lens 2810, and a light ray sensor that measures the value of light arriving at different locations on the sensor and from difference incident directions. In this context, measuring the value of light may be implemented by detecting light arriving at different locations at the sensor, together with characteristics of that light such as intensity to generate a value.

FIG. 1 shows an imaging system 100, according to another example embodiment of the present invention. The imaging system 100 includes an imaging arrangement 190 having a main lens 110, a microlens array 120 and a photosensor array 130. In this case, the microlens array 120 and photosensor array 130 implement a light ray sensor. Although FIG. 1 illustrates a particular main lens 110 (single element) and particular microlens array 120, those skilled in the art will recognize that a variety of lenses and/or microlens arrays (currently available or developed in the future) are selectively implemented with a similar approach by, for example, replacing the shown main lens and/or microlens array.

Rays of light from a single point on a subject 105 in an imaged scene are brought to a single convergence point on the focal plane of the microlens array 120. For instance, when the imaged point on the subject 105 is at a distance from the main lens that is conjugate to the distance from the microlens array to the main lens, the dimension "d" is about equal to the dimension "s" as shown. A microlens 122 at this convergence point separates these rays of light based on the direction of the light, creating a focused image of the aperture of the main lens 110 on the photosensors underneath the microlens.

The photosensor array 130 detects light incident upon it and generates an output that is processed using one or more of a variety of components. In this application, the output light data is passed to sensor data processing circuitry 140, which uses the data together with positional information about each photosensor providing the data in generating an image of the scene (e.g., including subjects 105, 106 and 107). The sensor data processing circuitry 140 is implemented, for example, with a computer or other processing circuit selectively implemented in a common component (e.g., a chip) or in different components. In one implementation, a portion of the sensor data processing circuitry 140 is implemented in the imaging arrangement 390, with another portion of implemented in an external computer. Using the detected light (and, e.g., characteristics of the detected light) together with a known direction from which the light arrived at the microlens array (as computed using a known location of each photosensor), the sensor data processing circuitry 140 selectively refocuses and/or corrects light data in forming an image (where refocusing may be correcting). Various approaches to processing detected light data are described in detail below, with and without reference to other figures. These approaches may be selectively implemented with the sensor data processing circuitry 140 consistent with the above.

Different portions of the imaging system 100 are selectively implemented in a common or separate physical arrangement, depending upon the particular application. For example, when implemented with a variety of applications, the microlens array 120 and the photosensor array 130 are combined into a common arrangement 180. In some applications, the microlens array 120 and the photosensor array 130 are coupled together on a common chip or other circuit arrangement. When implemented with a hand-held device such as a camera-like device, the main lens 110, microlens array 120 and photosensor array 130 are selectively combined into a common imaging arrangement 190 integrated with the hand-held device. Furthermore, certain applications involve the implementation of some or all of the sensor data processing circuitry 140 in a common circuit arrangement with the photosensor array 130 (e.g., on a common chip).

In some applications, the imaging arrangement 100 includes a preview arrangement 150 for presenting a preview image to a user capturing images. The preview arrangement is communicatively coupled to receive image data from the photosensor array 130. A preview processor 160 processes the image data to generate a preview image that is displayed on a preview screen 170. In some applications, the preview processor 160 is implemented together with the image sensor 180, on a common chip and/or in a common circuit. In applications where the sensor data processing circuitry 140 is implemented with the photosensor array 130 as discussed above, the preview processor 160 is selectively implemented with the sensor data processing circuitry 140, with some or all of the image data collected by the photosensor array 130 used to generate the preview image.

The preview image may be generated using relatively fewer computational functions and/or less data than that used to generate a final image. For instance, when implemented with a hand-held imaging device such as a camera or cell phone, a preview image that does not effect any focusing or lens correction may be sufficient. In this regard, it may be desirable to implement processing circuitry that is relatively inexpensive and/or small to generate the preview image. In such applications, the preview processor generates the image at a relatively low-computational cost and/or using less data, for example by using the first extended depth of field computational method as described above.

The imaging system 100 is implemented in a variety of manners, depending upon the application. For instance, while the microlens array 120 is shown with several distinguishable microlenses by way of example, the array is generally implemented with a multitude (e.g., thousands or millions) of microlenses. The photosensor array 130 generally includes a relatively finer pitch than the microlens array 120, with several photosensors for each microlens in the microlens array 120. In addition, the microlenses in the microlens array 120 and the photosensors in the photosensor array 130 are generally positioned such that light passing via each microlens to the photosensor array does not overlap light passed via adjacent microlenses.

Figure 10:
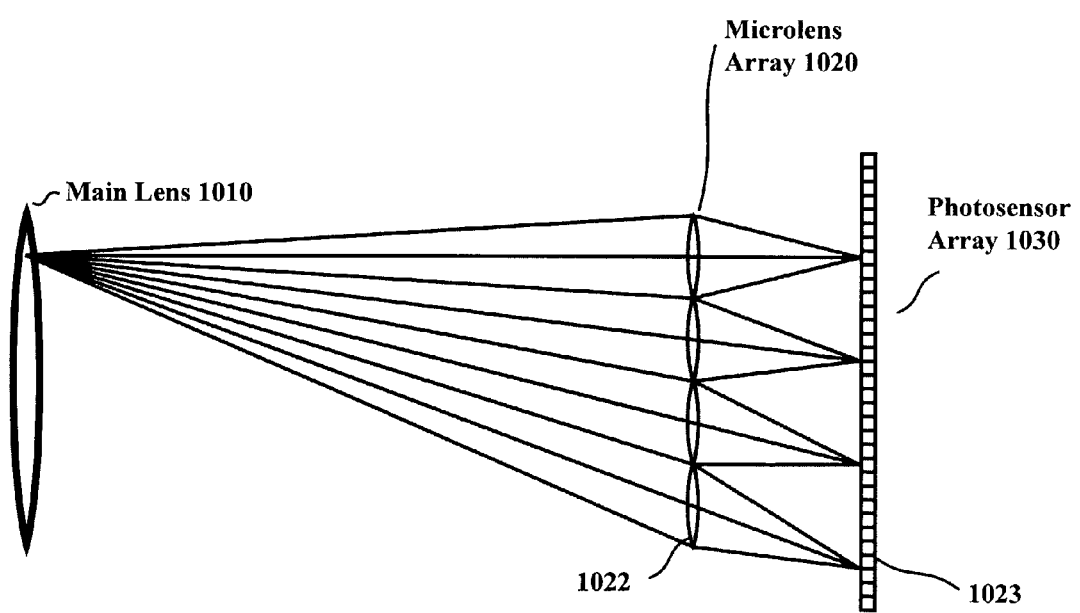
FIG. 10 illustrates one example approach to separating light rays, according to another example embodiment of the present invention.

In various applications, the main lens 110 is translated along its optical axis (as shown in FIG. 1, in a horizontal direction) to focus on a subject of interest at a desired depth "d" as exemplified between the main lens and an example imaging subject 105. By way of example, light rays from a single point on the subject 105 are shown for purposes of this discussion. These light rays are brought to a single convergence point at microlens 122 on the focal plane of the microlens array 120. The microlens 122 separates these rays of light based on direction, creating a focused image of the aperture of the main lens 110 on a set of pixels 132 in the array of pixels underneath the microlens. FIG. 10 illustrates one example approach to separating light rays, such that all rays emanating from a point on a main lens 1010 and arriving anywhere on the surface of the same microlens (e.g., 1022) are directed by that microlens to converge at the same point on a photosensor (e.g., 1023). This approach shown in FIG. 10 may, for example, be implemented in connection with FIG. 1 (i.e., with the main lens 1010 implemented for main lens 110, with microlens array 1020 implemented for microlens array 120, and with photosensor array 1030 implemented for photosensor array 130).

The image that forms under a particular microlens in the microlens array 122 dictates the directional resolution of the system for that location on the imaging plane. In some applications, directional resolution is enhanced by facilitating sharp microlens images, with the microlenses focused on the principal plane of the main lens. In certain applications the microlenses are at least two orders of magnitude smaller than the separation between the microlens array and the main lens 110. In these applications, the main lens 110 is effectively at the microlenses' optical infinity; to focus the microlenses, the photosensor array 130 is located in a plane at the microlenses' focal depth.

The separation "s" between the main lens 110 and the microlens array 120 is selected to achieve a sharp image within the depth of field of the microlenses. In many applications, this separation is accurate to within about $\Delta x_p \cdot (f_m / \Delta x_m)$, where $\Delta x_p$ is the width of a sensor pixel, $f_m$ is the focal depth of the microlenses and $\Delta x_m$ is the width of the microlenses. In one particular application, $\Delta x_p$ is about 9 microns, $f_m$ is about 500 microns and. $\Delta x_m$ is about 125 microns, with the separation between the microlens array 120 and the photosensor array 130 being accurate to about 36 microns.

The microlens array 120 is implemented using one or more of a variety of microlenses and arrangements thereof. In one example embodiment, a plane of microlenses with potentially spatially varying properties is implemented as the microlens array 120. For example, the microlens array may include lenses that are homogeneous and/or inhomogeneous, square in extent or non-square in extent, regularly distributed or non-regularly distributed, and in a pattern than is repeating or non-repeating, with portions that are optionally masked. The microlenses themselves may be convex, non-convex, or have an arbitrary profile to effect a desired physical direction of light, and may vary in profile from microlens to microlens on the plane. Various distributions and lens profiles are selectively combined. These various embodiments provide sampling patterns that are higher spatially (correspondingly lower angularly) in some regions of the array, and higher angularly (correspondingly lower spatially) in other regions. One use of such data facilitates interpolation to match desired spatial and angular resolution in the 4D space.

Figure 24A:
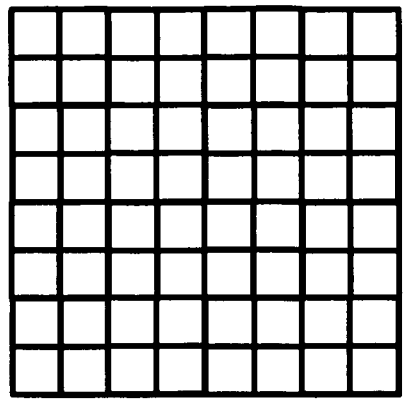
FIGS. 24A-B show differing views of a portion of a microlens array, according to another example embodiment of the present invention.

FIG. 24A illustrates a view (line of sight perpendicular to the plane) of a portion of a microlens array, according to another example embodiment of the present invention. The microlenses are square-shaped and regularly distributed in an array.

Figure 24B:
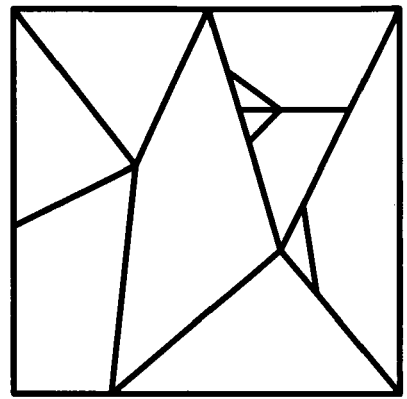

FIG. 24B illustrates a view of a portion of a microlens array, according to another example embodiment of the present invention. The microlens plane distribution is not regular or repeating, and the microlenses are arbitrarily shaped.

Figure 24C:
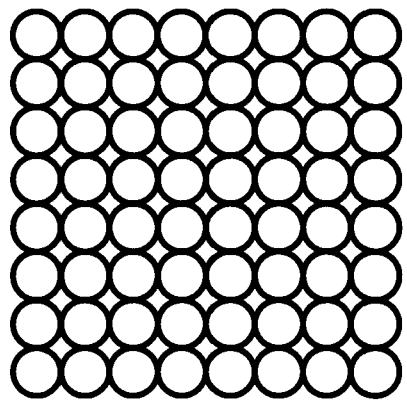
FIG. 24C illustrates images that appear on a photosensor, according to another example embodiment of the present invention.

FIG. 24C illustrates images that appear on the photosensor in connection with another example embodiment of the present invention, using a distribution such as that shown in FIG. 24A with a convex profile and a main lens having a circular aperture.

In other example embodiments, a regular mosaic of larger and smaller microlenses is used. In one implementation, the resulting photosensor data is interpolated to provide a homogeneous sampling that has the maximum spatial and angular resolutions of a microlens or microlenses in the mosaic.

Figure 19A:
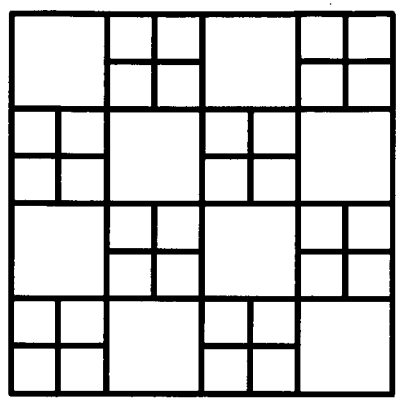
FIGS. 19A-19F illustrate approaches to implementing a mosaic array, according to another example embodiment of the present invention.
Figure 19B:
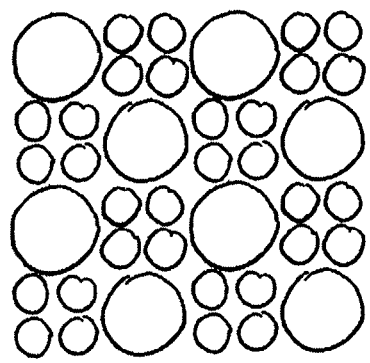
Figure 19C:
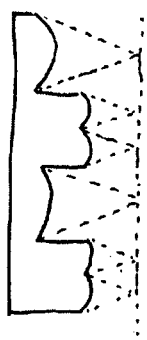

FIGS. 19A-19F illustrate approaches to implementing a mosaic array such as that described above, in connection with one or more example embodiments of the present invention. FIG. 19A is an overhead view of a plane showing example relative sizes and arrangement of the microlenses. FIG. 19B is an illustration of the shape of the images that form on the photosensor array after projection through each microlens in FIG. 19A. FIG. 19C is a cross-sectional view of the array in FIG. 19A, illustrating that the microlenses have the same f-number and their focal points share a common plane. This requires that the smaller microlenses are positioned closer to the focal plane than the larger ones. This causes the images of the main lens that appear underneath each microlens to be large without overlapping, and all appear in-focus on a photosensor that is placed at the plane containing the focal points.

Figure 19D:
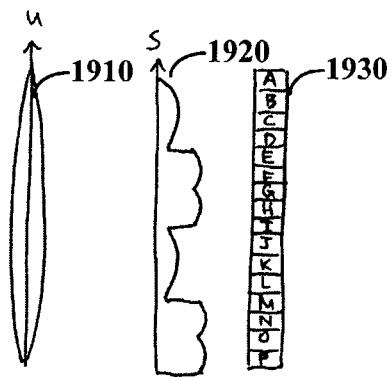

FIG. 19D shows a cross-sectional view of the microlenses shown in FIGS. 19A and 19C implemented in a full imaging arrangement containing a main lens 1910, a mosaic microlens array 1920 and photosensor arrangement 1930, according to another example embodiment of the present invention. Note that although the diagram has been shown with several microlenses and several pixels per microlens, the actual number of microlenses and pixels is selected using a variety of approaches, such as by determining the resolution requirements of the given application and implementing appropriate numbers of each.

Figure 19E:
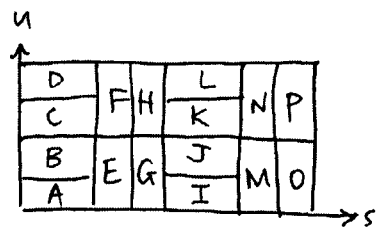

FIG. 19E is a Cartesian ray diagram representing the space of rays starting at u on the main lens 1910 and terminating at s on the microlens array 1920 (the space of rays is shown in 2D for clarity, although the full space of rays is 4D). The set of rays that are summed by each photosensor (labeled A-P) in FIG. 19C is shown on the Cartesian ray diagram in FIG. 19D. In the full 4D space of rays, each photosensor integrates a 4D box of rays. The 4D boxes for photosensors under the larger microlenses have half the width (twice the resolution) in the (u, v) directional axes, and twice the width (half the resolution) in the (x, y) spatial axes compared to photosensors under the smaller microlenses.

Figure 19F:
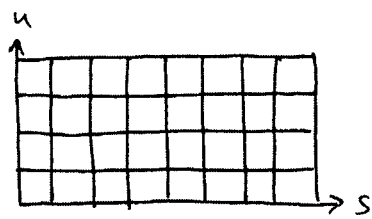

In another example embodiment, photosensor values are interpolated to a regular grid so that the resolution in all axes matches the maximum resolution in all axes. FIG. 19F illustrates such an approach, wherein the boxes of rays that represent each photosensor value are split by interpolating nearby box values. In the 2D ray space illustrated, each box is split into two, but in the 4D space, each box is split into four (split into two along each of its two longer sides). In some embodiments, the interpolated values are computed by analyzing the nearby values. In another embodiment, the interpolation is implemented as a weighted sum of the values of the original, unsplit boxes in a neighborhood of the desired value.

In some applications, the weighting is implemented in a manner that depends on a decision function based on the values in a neighborhood. For example, the weighting may interpolate along the axes that are least likely to contain an edge in the 4D function space. The likelihood of an edge near that value can be estimated from the magnitude of the gradient of the function values at those locations, as well as the components of the Laplacian of the function.

In another example embodiment, each of the microlenses (e.g., in the array 1920 of FIG. 19D or similar) is tilted inwards so that their optical axes are all centered on the main lens aperture. This approach reduces aberrations in the images that form under microlenses towards the edges of the array.

Referring again to FIG. 1, the aperture sizes of the main lens 110 and of the microlenses in the microlens array 120 (e.g., the effective sizes of the opening in the lenses) are also selected to meet specific applications in which the imaging arrangement 100 is implemented. In many applications, the relative aperture sizes are selected so that collected images are as large as possible without overlapping (i.e., such that light does not undesirably overlap onto an adjacent photosensor). This approach is facilitated by matching the f-numbers (focal ratios; i.e., the ratio of the aperture to the effective focal length of the lens) of the main lens and the microlenses. In this instance, the effective focal length, in terms of the f-number, for the main lens 110 is the ratio of the diameter of the aperture of the main lens to the distance "s" between the main lens 110 and the microlens array 120. In applications in which the principal plane of the main lens 110 is translated relative to the plane at which the microlens array 120 is located, the aperture of the main lens is selectively modified so as to maintain the ratio and thus the size of the images forming under each microlens in the microlens array. In some applications, different main lens aperture shapes such as a square aperture are used to achieve desirable (e.g., efficient) packing of the array of images under the microlens array on the photosensor surface.

The following discussion refers to a general application of the imaging arrangement 100 of FIG. 1, in connection with one or more example embodiments of the present invention. Considering a two-plane light field "L" inside the imaging arrangement 100, L(u,v,s,t) denotes the light traveling along a light ray that intersects the main lens 110 at (u, v) and that intersects the plane of the microlens array 120 at (s,t). Assuming ideal microlenses in the microlens array 120 and ideal photosensors (e.g., pixels) on aligned grids in the photosensor array 130, all the light that passes to a photosensor also passes through its square parent microlens in the microlens array 120, and through the photosensor's conjugate square on the main lens 110. These two square regions on the main lens 110 and microlens specify a small four-dimensional box in the light field, and the photosensor measures the total amount of light in the set of rays represented by this box. Correspondingly, each photosensor detects such a four-dimensional box in the light field; the light field detected by the photosensor array 130 thus is a box-filtered, rectilinear sampling of L(u,v,s,t).

Figure 11:
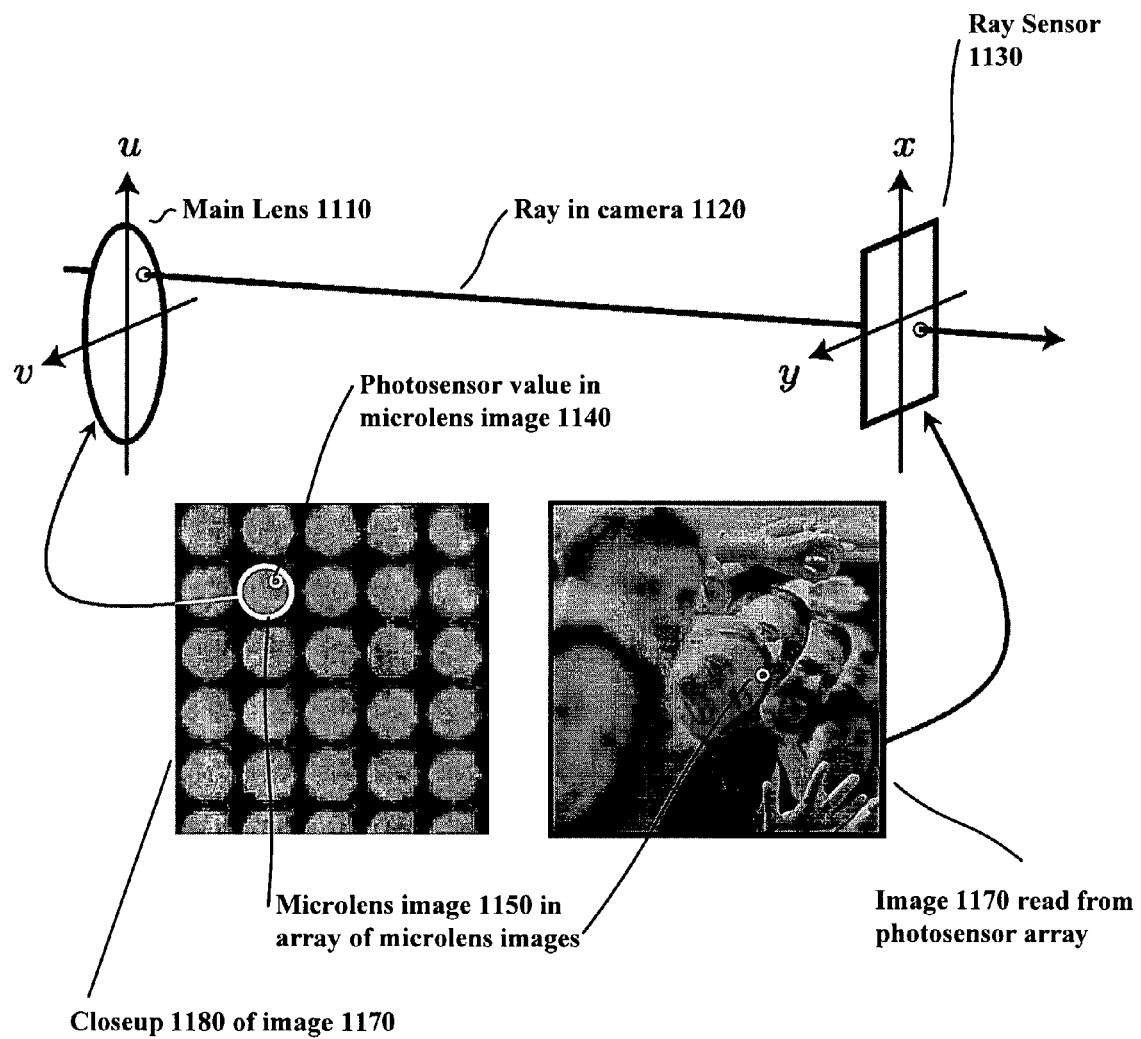
FIG. 11 illustrates an approach to the mapping of sensor pixel locations to rays in the L(u,v,s,t) space with respect to data collected, according to another example embodiment of the invention.

FIG. 11 illustrates an approach to the mapping of sensor pixel locations to rays in the L(u,v,s,t) space with respect to data collected, according to another example embodiment of the invention. The approach shown in FIG. 11 and discussed herein may be applicable, for example, to FIG. 1 with each photosensor in the photosensor array 130 corresponding to a sensor pixel. Image 1170 in the bottom right is a downsampling of raw data read from a ray sensor (photosensor) 1130, with the circular image 1150 that forms under one microlens circled. Image 1180 in the bottom left is a close-up representation of a portion of the raw data around the circled microlens image 1150, with one photosensor value 1140 circled within the microlens image. Since this circular image 1150 is an image of the lens aperture, the location of the selected pixel within the disk provides the (u, v) coordinates of the starting position of the illustrated ray 110 on the main lens. The location of the microlens image 1150 within the sensor image 1170 provides the (x, y) coordinates of the ray 1120.

Although the mapping of sensor elements to rays is discussed with respect to the figures (and other example embodiments), values associated with the various sensor elements are selectively represented by the value of the set of rays that is directed through optics to each particular sensor element. In the context of FIG. 1, each photosensor in the photosensor array can thus be implemented to provide a value that represents a set of light rays directed via the main lens 110 and microlens array 120 to the photosensor. That is, each photosensor generates an output in response to the light incident upon the photosensor, and the position of each photosensor, relative to the microlens array 120, is used to provide directional information about the incident light.

In one example embodiment, the resolution of the microlens array 120 is selected to match a particular application's desired resolution for final images. The resolution of the photosensor array 130 is selected so that each microlens covers as many photosensors as required to match the desired directional resolution of the application, or the finest resolution of photosensors that may be implemented. In this regard, the resolution of the imaging system 100 (and other systems discussed herein) is selectively tailored to particular applications, with considerations such as the type of imaging, cost, complexity and available equipment used to arrive at a particular resolution.

Once image data is captured via optics and sensors (e.g., using imaging arrangement 190 in FIG. 1), a variety of computational functions and arrangements are implemented to selectively process the image data. In one example embodiment of the present invention, different sets of photosensors capture these separated light rays from each microlens and pass information about the captured light rays to a computational component such as a processor. Images of the scene are computed from the set of measured light rays.

In the context of FIG. 1, sensor data processing circuitry 140 is implemented to process the image data and compute images of the scene including subjects 105, 106 and 107. In some applications, a preview arrangement 150 is also implemented to generate a preview image using a preview processor 160, with the preview image displayed on a preview screen 170. The previous processor 160 is selectively implemented with the sensor data processing circuitry 140, with a preview image generated in a manner not inconsistent, for example, with approaches discussed below.

In another embodiment, for each pixel in an image output from a sensor arrangement, the computational component weights and sums a subset of the measured rays of light. In addition, the computational component may analyze and combine a set of images computed in the manner described above, for example, using an image compositing approach. Although the present invention is not necessarily limited to such applications, various aspects of the invention may be appreciated through the discussion of several specific example embodiments of such a computational component.

In connection with various example embodiments, image data processing involves refocusing at least a portion of an image being captured. In some embodiments, an output image is generated in the context of a photograph focused on desired elements of a particular scene. In some embodiments, the computed photograph is focused at a particular desired depth in the world (scene), with misfocus blur increasing away from the desired depth as in a conventional photograph. Different focal depths are selected to focus upon different subjects in the scene.

Figure 12:
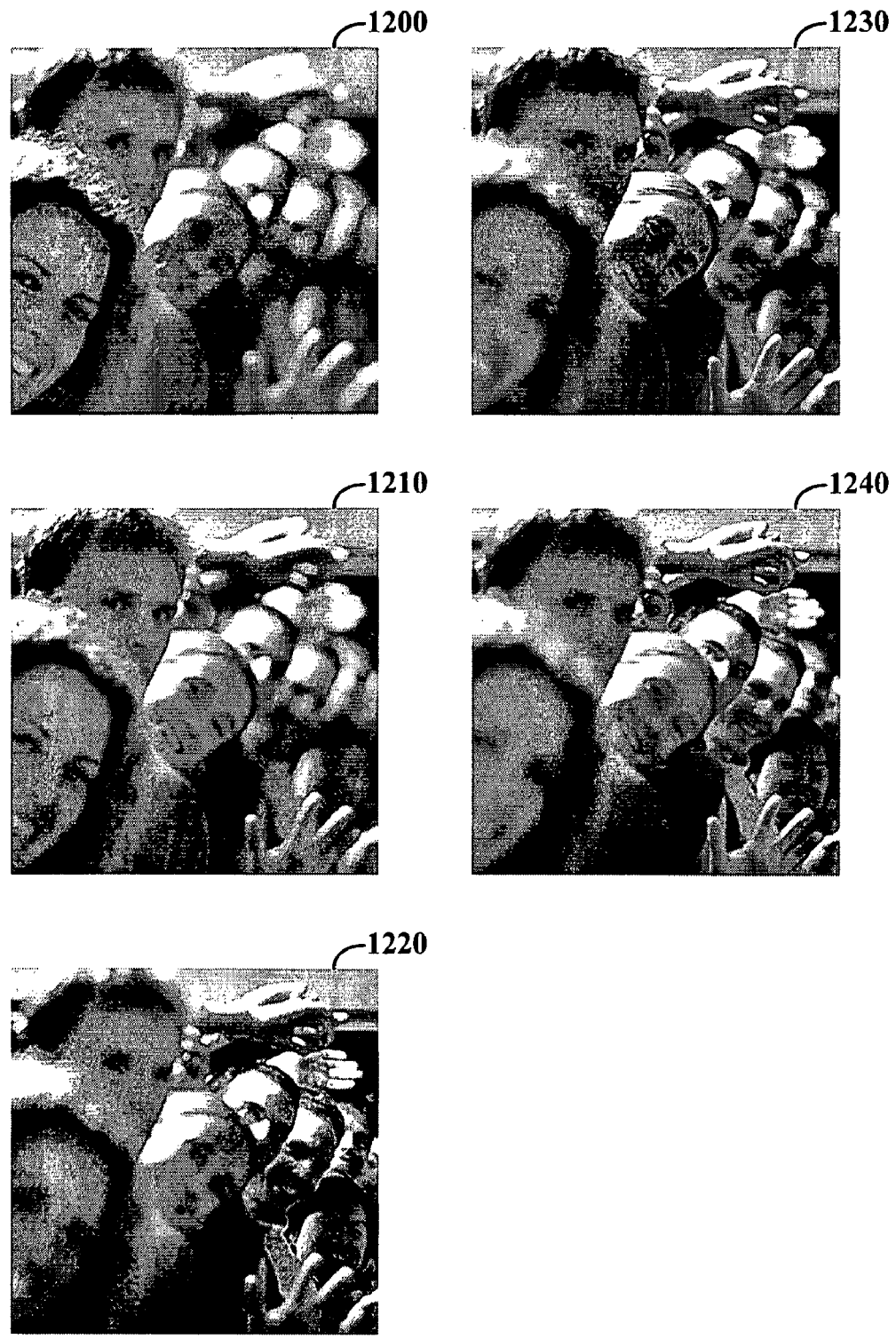
FIG. 12 illustrates several images refocused at different depths, according to another example embodiment of the present invention.

FIG. 12 illustrates several images 1200-1240 refocused at different depths, computed from a single light field measured in accordance with another example embodiment of the present invention. The approach shown in FIG. 12 may, for example, be implemented using an imaging arrangement such as that shown in FIG. 1.

Figures 13A, 13B:
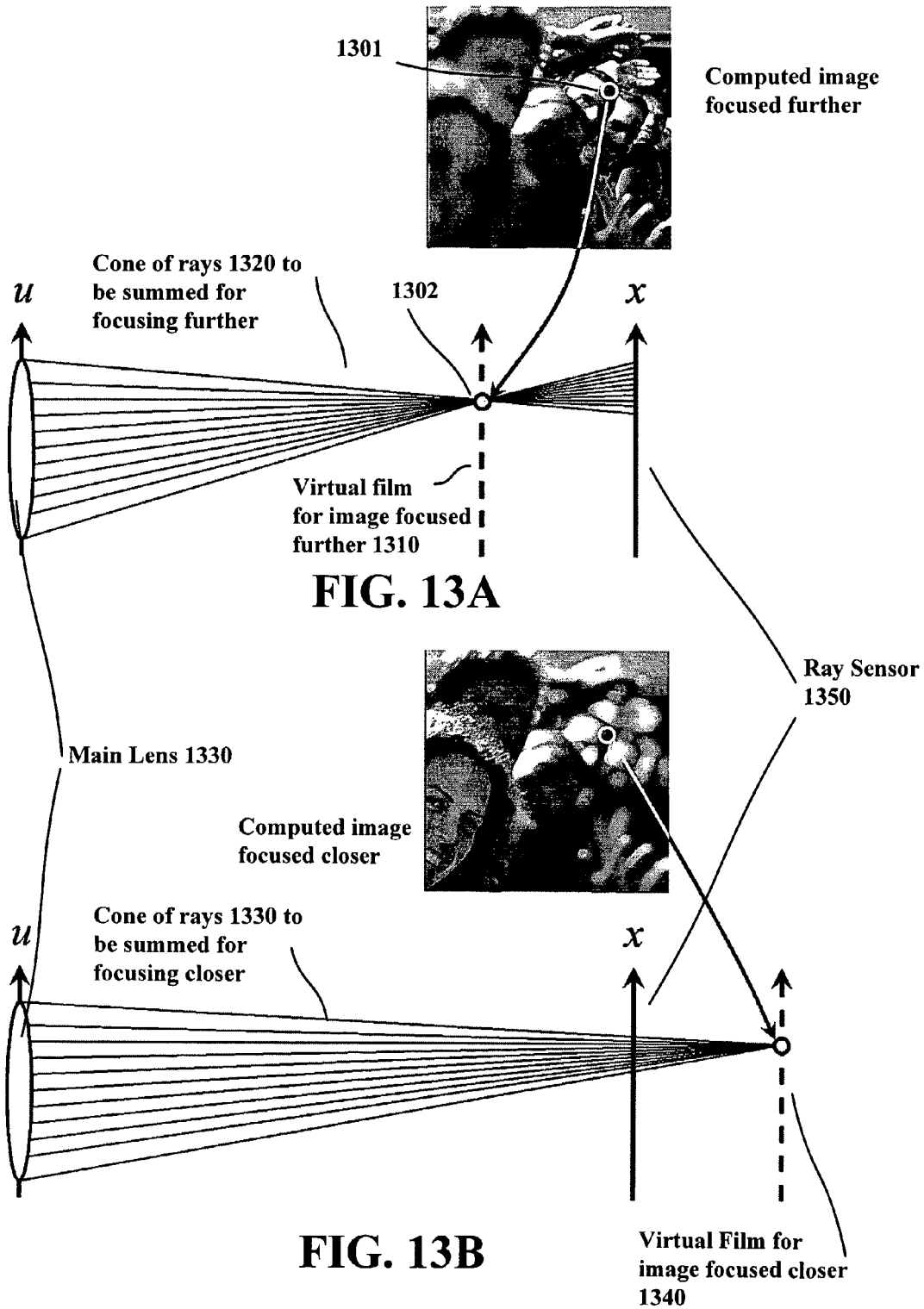
FIG. 13A shows an imaging configuration in 2D, according to another example embodiment of the present invention.
FIG. 13B shows a cone of rays from a 3D point summed for a pixel, according to another example embodiment of the present invention.

FIGS. 13A and 13B show a refocusing approach, according to another example embodiment of the present invention. This approach may be implemented, for example, with a computational/processor component of an imaging system, such as the sensor data processing circuitry 140 in FIG. 1. Each output pixel (e.g., 1301) from an imaging arrangement corresponds to a three-dimensional (3D) point (e.g., 1302) on a virtual film plane 1310. This virtual film plane 1310 is located behind a main lens 1330, where the plane 1310 is optically conjugate to the desired focal plane in the world (not shown). That is, the virtual film plane 1310 is located at a position at which a film plane would desirably be located to capture a simple two-dimensional (2D) image (e.g., the position is comparable to the position at which a photographic film would be located with a conventional camera in order to capture a 2D image). By separating light by direction (e.g., using the microlens array 120 of FIG. 1), the light arriving at the virtual film plane 1310 can be selectively computed. In this regard, the value for the output pixel 1301 is computed by summing the cone of light rays 1320 that converge on the corresponding 3D point 1302. Values for these rays are gleaned from the data collected by the ray sensor 1350. FIG. 13A shows an imaging configuration in 2D for visual simplicity. In FIG. 13B, a cone of rays 1330 from the 3D point 1340 is summed for the same pixel 1301, with the chosen world focal depth if closer to the main lens.

In some embodiments, the required light ray values do not correspond exactly to the discrete sample locations captured by the ray sensor. In some embodiments, the light ray value is estimated as a weighted sum of selected close sample locations. In some implementations, this weighting approach corresponds to a four-dimensional filter kernel that reconstructs a continuous four-dimensional light field from the discrete sensor samples. In some implementations, this four-dimensional filter is implemented with a four-dimensional tent function corresponding to quadrilinear interpolation of the 16 nearest samples in the four dimensional space.

Figure 35:
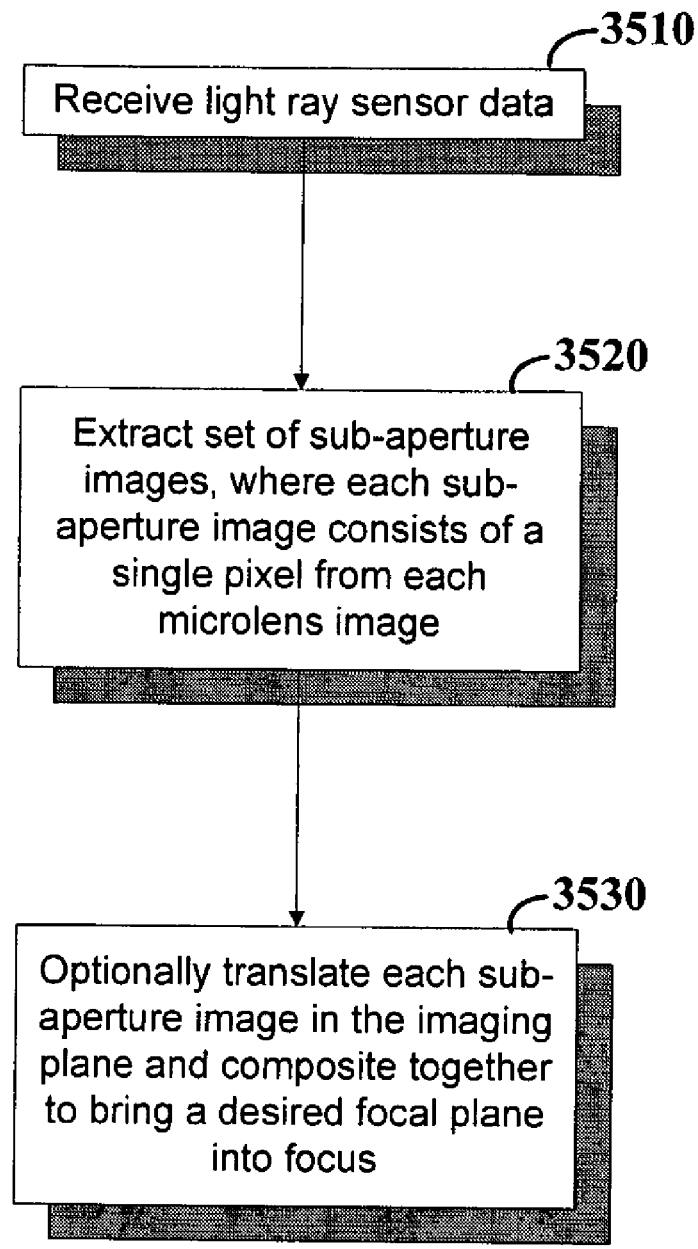
FIG. 35 is a process flow diagram for computing a refocused image from received light ray sensor data, according to another example embodiment of the present invention.

FIG. 35 is a process flow diagram for computing a refocused image from received light ray sensor data, according to another example embodiment of the present invention. At block 3520 a set of sub-aperture images is extracted from light ray sensor data 3510, where each sub-aperture image consists of a single pixel under each microlens image where the pixels are at the same relative position under its microlens. At block 3530, the set of sub-aperture images is combined to produce the final output image. The sub-aperture images are optionally translated relative to one another and composited to bring a desired plane into focus.

In another example embodiment, darkening associated with pixels near a border of an output image is mitigated. For instance, with the pixels near the border of an output image, some required rays may not have been captured in the measured light field (they may exceed the spatial or directional bounds of the imaging arrangement, such as the microlens array 120 and photosensor array 130 in FIG. 1). For applications in which this darkening is undesirable, the pixel values are normalized by dividing a value associated with the pixels (e.g., as captured by a photosensor array) by the fraction of rays that are actually found in the measured light field.

As discussed above, a variety of different computational approaches are chosen for different applications. The following discussion addresses various such approaches. In some applications, reference is made to figures, and in other applications, the approaches are discussed generally. In each of these applications, the particular approaches may be implemented using a computational-type component, such as the sensor data processing circuitry 140 shown in FIG. 1.

Figure 25:
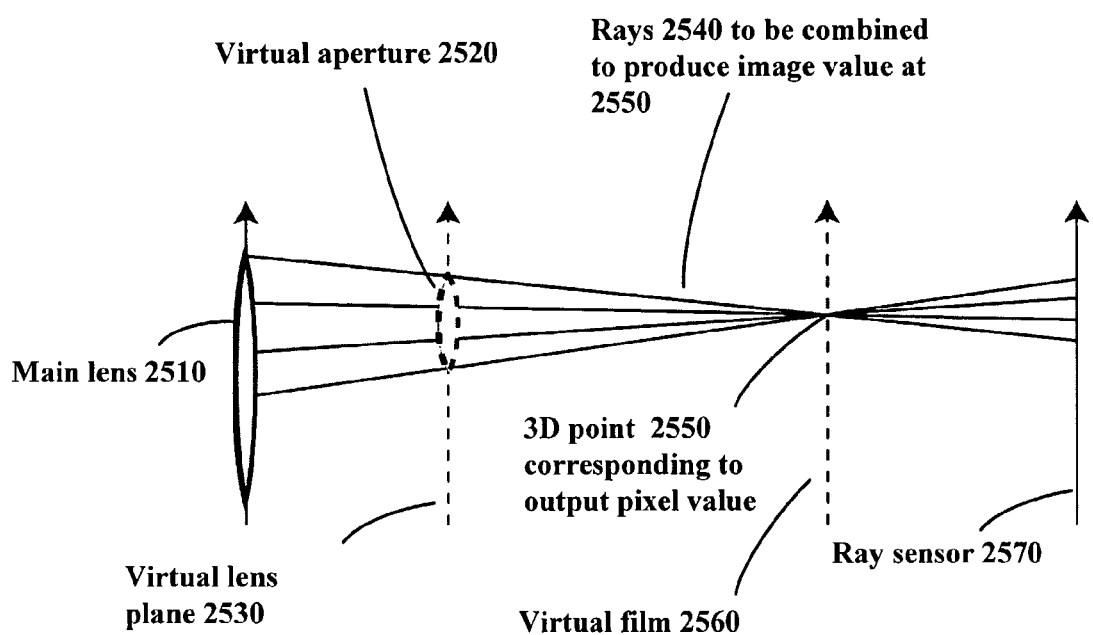
FIG. 25 illustrates an example embodiment of the present invention, in which a virtual image is computed as it would have appeared on virtual film.

In another example embodiment, an imaging methodology for each output pixel for a particular imaging system corresponds to a virtual camera model in which a virtual film is rotated or deformed, arbitrarily and/or selectively, and a virtual main lens aperture is correspondingly moved and modified in size as appropriate. By way of example, FIG. 25 illustrates an example embodiment in which a virtual image is computed as it would have appeared on virtual film 2560 if it had been present behind a virtual lens aperture 2520 of arbitrary size on a virtual lens plane 2530 that is permitted to be non-coincident with the physical main lens plane 2510. The value of the pixel corresponding to point 2550 on the virtual film 2560 is computed by summing the rays passing through the virtual aperture 2520 and converging on point 2550, which are found by their intersection point and incident direction on ray sensor 2570.

Figure 26:
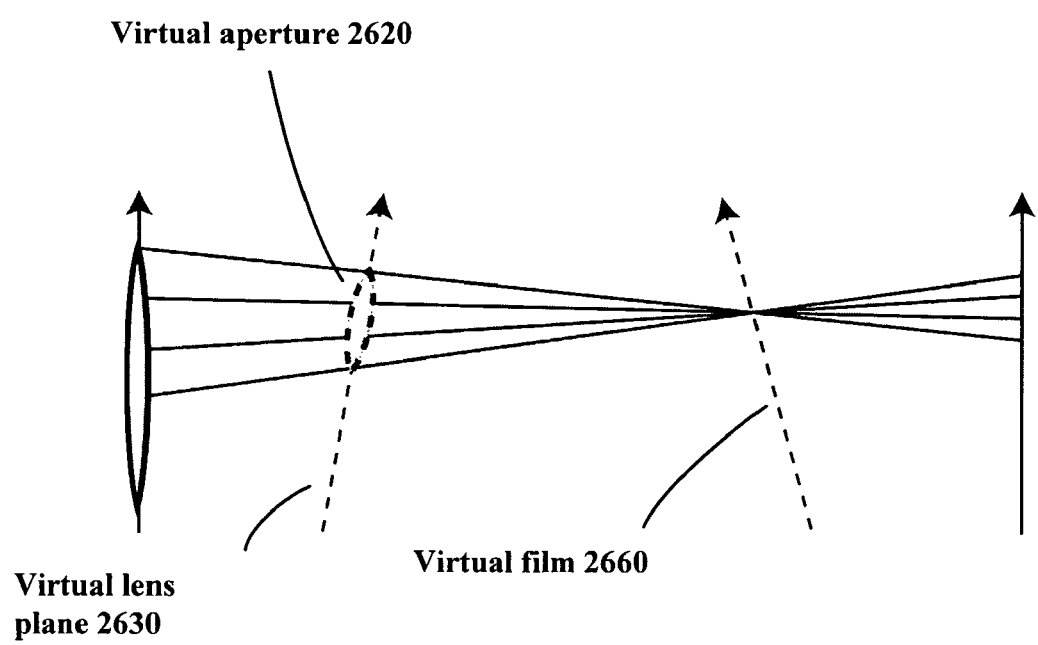
FIG. 26 shows an approach to manipulating a virtual lens plane, according to another example embodiment of the present invention.

FIG. 26 shows an approach to manipulating a virtual lens plane, according to another example embodiment of the present invention. A virtual lens plane 2630 and/or virtual film plant 2660 selectively tilted, relative to a physical main lens or other reference. An image computed using this approach has a resulting world focal plane that is not parallel to the imaging plane.

Figure 27:
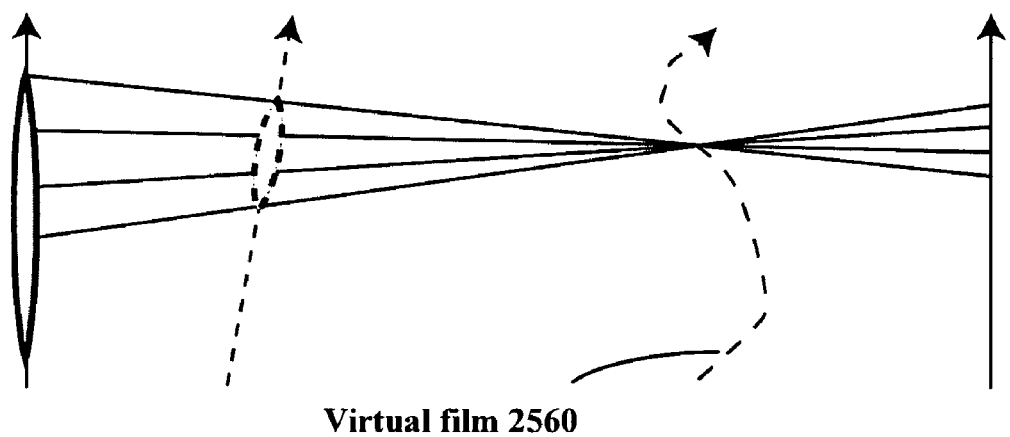
FIG. 27 illustrates that the virtual film may take any shape, according to another example embodiment of the present invention.

In another example embodiment, as exemplified in FIG. 27, the virtual film 2560 need not be planar, but may take any shape.

A variety of approaches involve selective implementation of different apertures. In one example embodiment, the virtual aperture on the virtual lens plane is a generally circular hole, and in other example embodiments, the virtual aperture is generally non-circular and/or is implemented with multiple distinct regions of any shape. In these and other embodiments, the notion of "virtual aperture" can be generalized, and in some applications, corresponds to an approach involving the processing of light data to correspond to light that would be received via a selected "virtual" aperture.

In various embodiments, a virtual aperture approach is implemented with a pre-determined but arbitrary function on a virtual lens plane. FIGS. 31A-31D illustrate various scalar functions that are selectively implemented as the virtual aperture function in connection with one or more example embodiments. The various functions include, for example, smoothly varying values (as exemplified in FIG. 31B), implementing a plurality of distinct regions (as exemplified in FIG. 31A), and taking on negative values (as exemplified in FIG. 31D). To compute the value of a point on a virtual film, all rays that start at different points on the virtual lens and converge on the point on the virtual film are weighted by the virtual aperture function and summed. In various other embodiments, the final value is computed with an arbitrary computational function that depends on the ray values. For example, the computational function may not correspond to a weighting by a virtual aperture function, but may contain discontinuous program branches depending on the value of test functions computed on the ray values.

Figure 32:
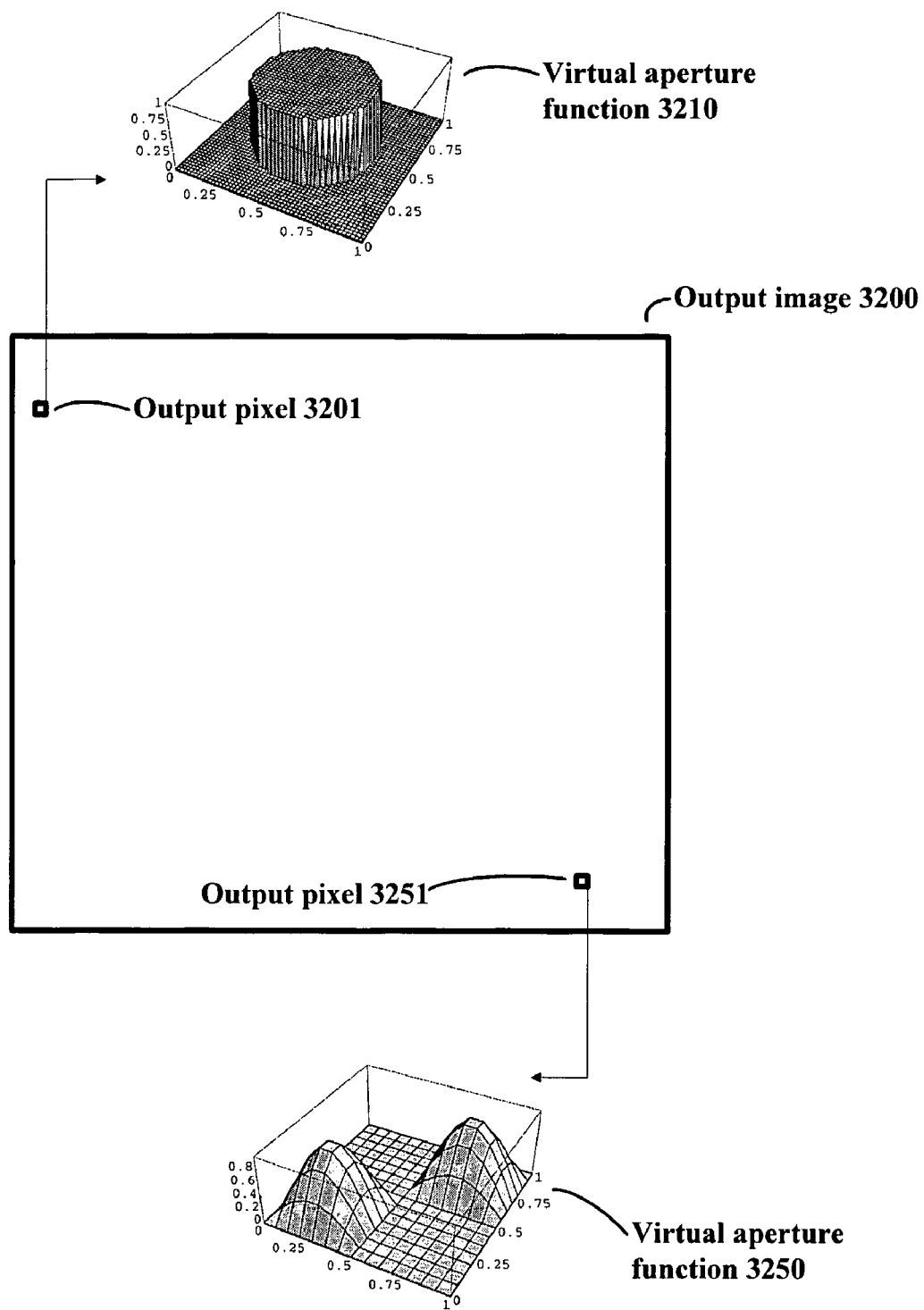
FIG. 32 shows a virtual aperture function which varies from pixel to pixel; according to another example embodiment of the present invention.

In other example embodiments, as may be implemented in combination with the other example embodiments described herein, a method of computing output pixels is chosen independently. For example, in one example embodiment, parameters including the orientation of a virtual lens plane and the size of the virtual aperture are varied continuously for each output pixel. In another example, as illustrated in FIG. 32, the virtual aperture function used to integrate rays for each output pixel is varied from pixel to pixel. In an output image 3200, pixel 3201 uses virtual aperture function 3210 and pixel 3251 uses virtual aperture function 3250.

In another example embodiment, a virtual aperture function varies from pixel to pixel. In one specific embodiment, the function is chosen to mask out rays from undesired portions of a particular scene, such as an undesired object in the foreground.

Figure 33:
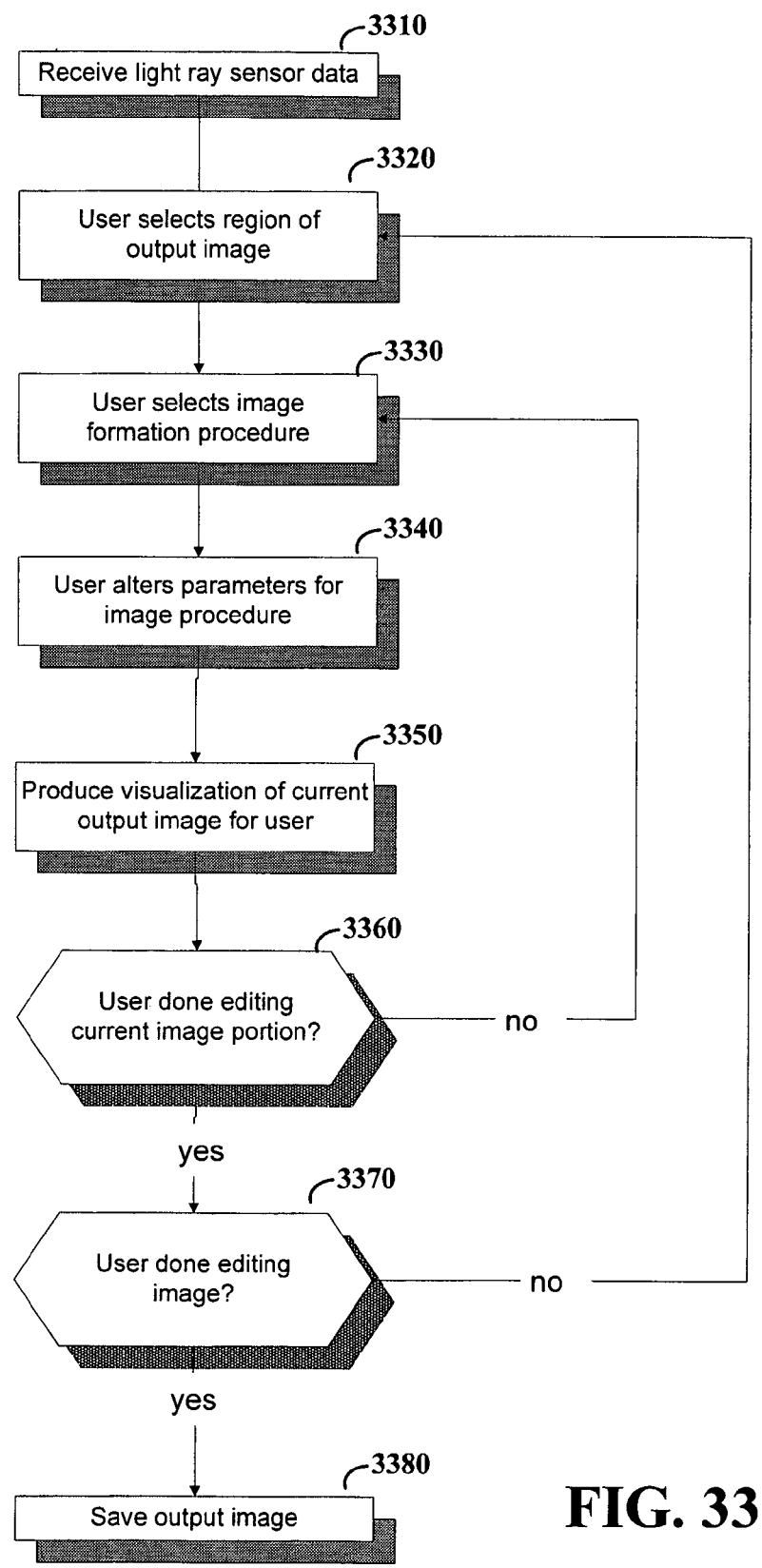
FIG. 33 is a process flow diagram of a user selecting a region of an output image, editing an image portion and saving the output image, according to another example embodiment of the present invention.

In another example embodiment, a human user chooses virtual aperture parameters interactively, with light data processed in accordance with the selections. FIG. 33 is a process flow diagram showing one such example embodiment. In the first block 3310, the process receives data from a light ray sensor. In block 3320, a user selects a region of an output image; in block 3330 a user selects an image formation method; and in block 3340, the user alters parameters for the selected method and visually examines a computed image of the scene at block 3350 (for example on a computer monitor). Block 3360 checks if the user is done editing the image portion, and if not returns to block 3330. Block 3370 checks whether the user is done choosing portions of the image to edit, and if not returns to block 3320. If editing is complete, block 3380 saves the final edited image.

In another example embodiment, an image with extended depth of field is computed by focusing on more than one subject at the same time. In one implementation, the depth of field of the output image is extended by simulating conventional photographic imaging with a stopped-down (reduced size) main lens aperture. For each output pixel, an evaluation is performed using the rays of light that would have converged at the output pixel through an aperture (on the virtual lens plane) that is smaller than the aperture used in ray sensing.

Figure 4:
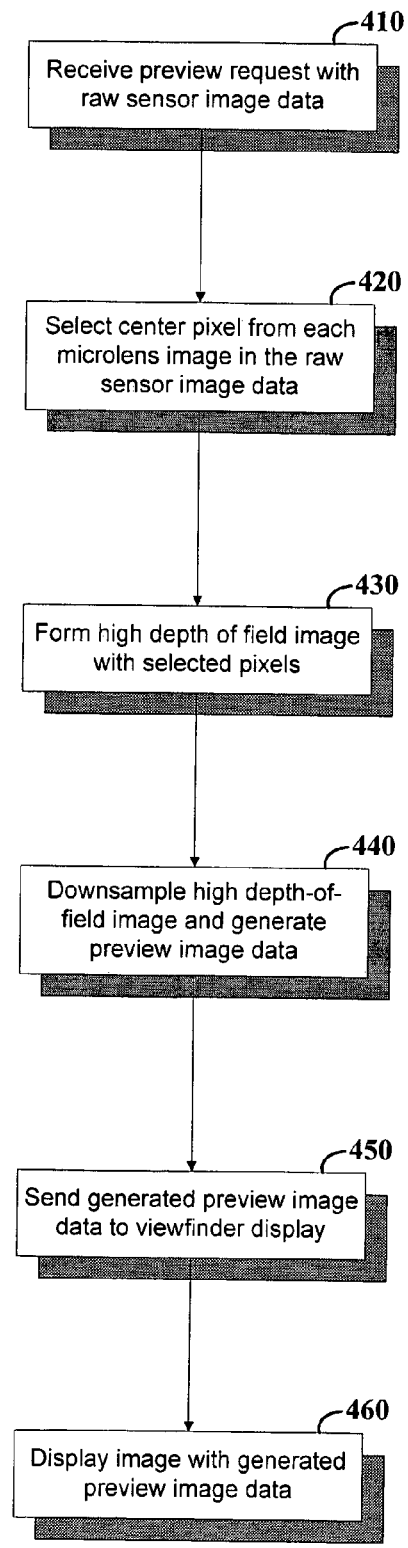
FIG. 4 is a process flow diagram for generating a preview image, according to another example embodiment of the present invention.

In one implementation involving the example system 100 shown in FIG. 1, the depth of field is extended by extracting a photosensor value under each microlens image, where each photosensor is located at the same relative position within each microlens image. With respect to FIG. 1, extending the depth of field produces an image in which not only the subject 105 is in focus (due to the correlation between the distances "d" and "s") but also objects at a different depth, such as subjects 106 and 107, which may otherwise be blurry due to misfocus. This approach to extending the depth of field, coupled with optional downsampling of the resulting image, is computationally efficient. This approach is selectively implemented in applications where noise generated with the image is tolerable, such as where the image generated is for preview purposes (e.g., for display at the preview screen 170 in FIG. 1). FIG. 4, discussed below, is further directed to approaches to the generation of a preview image.

FIGS. 14A and 14B illustrate an approach to computing images with different depths of field, in connection with one or more example embodiments. FIG. 14A shows an image and close-up computed with refocusing. Note that the face in the close-up is blurry due to shallow depth of field. The middle row of FIG. 14B shows the final image computed with an extended depth of field approach such as that described in the previous paragraph.

Figure 8:
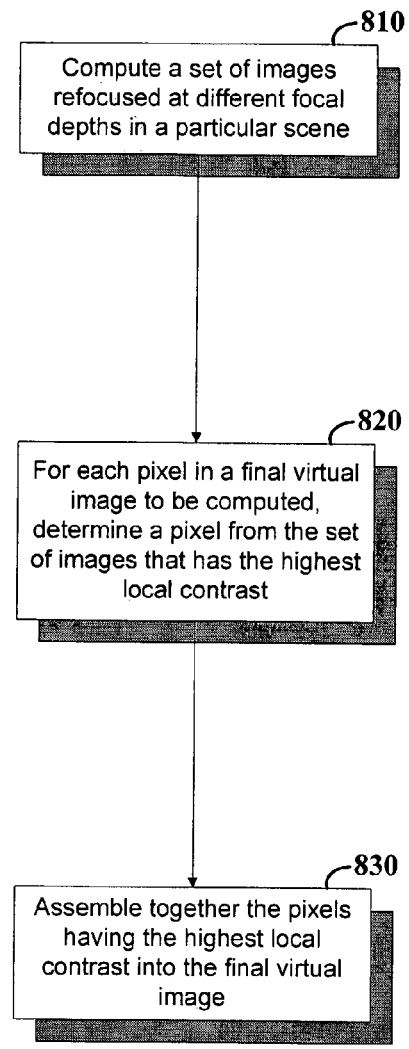
FIG. 8 is a process flow diagram for extending the depth of field in an image, according to another example embodiment of the present invention.

FIG. 8 is a process flow diagram for another computational approach to extending the depth of field in an image, according to another example embodiment of the present invention. At block 810, a set of images refocused at all focal depths in a particular scene is refocused. At block 820 and for each pixel, a pixel is determined from a set of images that has the highest local contrast. At block 830, the pixels having the highest local contrast are assembled into a final virtual image. With this approach, a desirable signal-to-noise ratio (SNR) can be obtained, using a relatively high number of pixels (e.g., relative to selecting a single pixel (photosensor) for each microlens in a microlens array). Referring to FIG. 14C, the example image shown is produced using an approach similar to that described in connection with FIG. 8 and exhibits relatively low image noise.

In one alternative embodiment, a minimum set of refocused images to compute is defined as follows, in terms of the distance between a virtual film plane for each refocused image and the principal plane of the main lens via which the light for the image is passed to the virtual film plane. A minimum distance is set at the focal length of the main lens, and the maximum distance set at the conjugate depth for the closest object in the scene. The separation between each virtual film plane is no more than $\Delta x_m f/A$, where $\Delta x_m$ is the width of a microlens, f is the separation between the main lens and the microlens array, and A is the width of the lens aperture.

In another example embodiment, refocused images are combined to produce an extended depth of field image at each final pixel to retain the pixel that is best focused in any of the set of refocused images. In another embodiment pixels to retain are chosen by enhancing the local contrast and coherence with neighboring pixels. For general information regarding imaging, and for specific information regarding approaches to imaging involving enhancing local contrast, reference may be made to Agarwala, A., Dontcheva, M., Agrawala, M., Drucker, S., Colburn, A., Curless, B., Salesin, D., Cohen, M., Interactive Digital Photomontage, in ACM Transactions on Graphics, 23, 3 (2004), 292-300, which is fully incorporated herein by reference.

In another example embodiment of the present invention, an extended depth of field image is computed as follows. For each output image pixel, a refocusing computation is performed at the pixel to focus at different depths. At each depth, a measure of the homogeneity of the rays that converge is computed. The depth that produces the (relative) maximum homogeneity is chosen and kept for that pixel value. With this approach, where an image pixel is in focus, all of its rays originate from the same point in the scene and thus are likely to have similar color and intensity.

Although the measure of homogeneity can be defined in various ways, for many applications, the following measure of homogeneity is used: for each color component of each ray, the squared difference of that color intensity is computed from the corresponding color component of the central ray (the ray that arrives at the pixel at an angle closest to the optical axis of the main lens). All of these squared differences are summed, and the homogeneity is taken to be the reciprocal of the sum.

Figure 34:
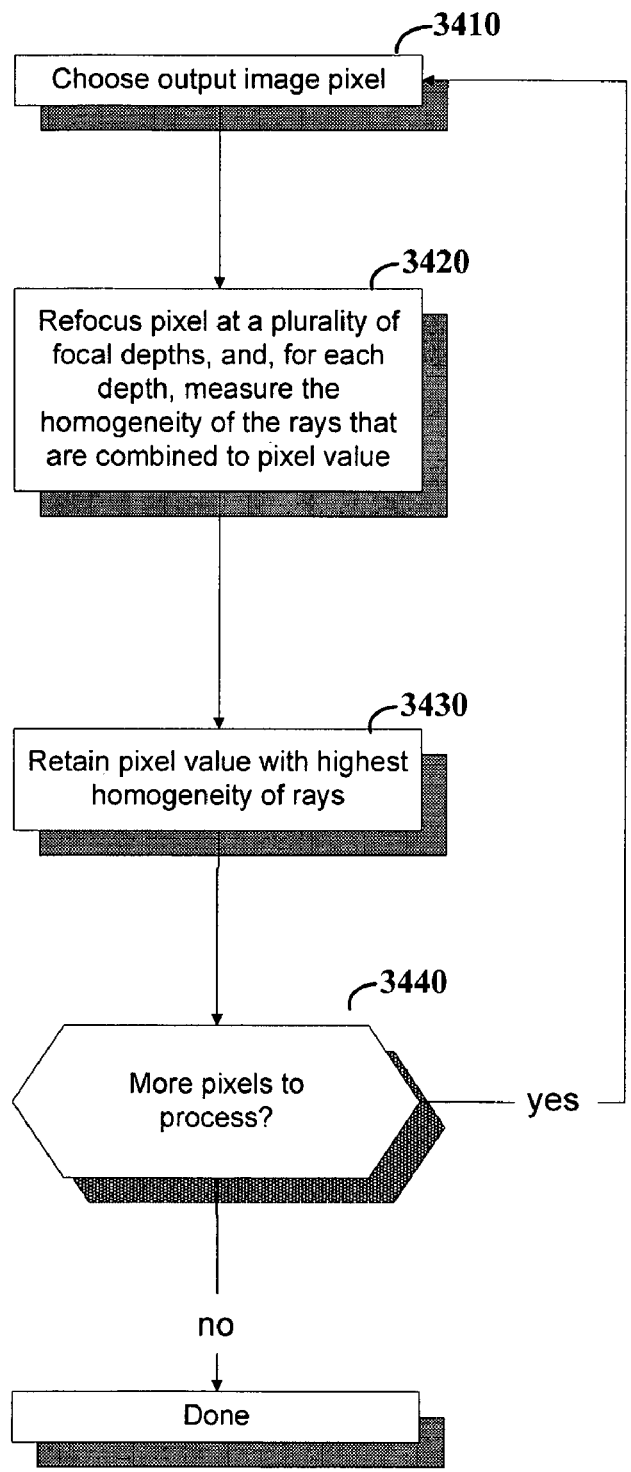
FIG. 34 is a process flow diagram for extending the depth of field in an image, according to another example embodiment of the present invention.

FIG. 34 is a process flow diagram for extending the depth of field in an image, according to another example embodiment of the present invention. At block 3410, a pixel is selected in a virtual image to be computed. At block 3420, the pixel is refocused at a plurality of focal depths, and the homogeneity of the rays that are combined to refocus at each depth is computed. At block 3430, the refocused pixel value associated with the highest homogeneity of rays that are combined is retained as the final output image pixel value. The process continues at block 3440 until all pixels are processed.

In another example embodiment, the above process is adapted so that the selection of final pixel values takes into account the neighboring pixel values, and the homogeneity of the associated rays that are combined to compute those pixel values.

Figure 9:
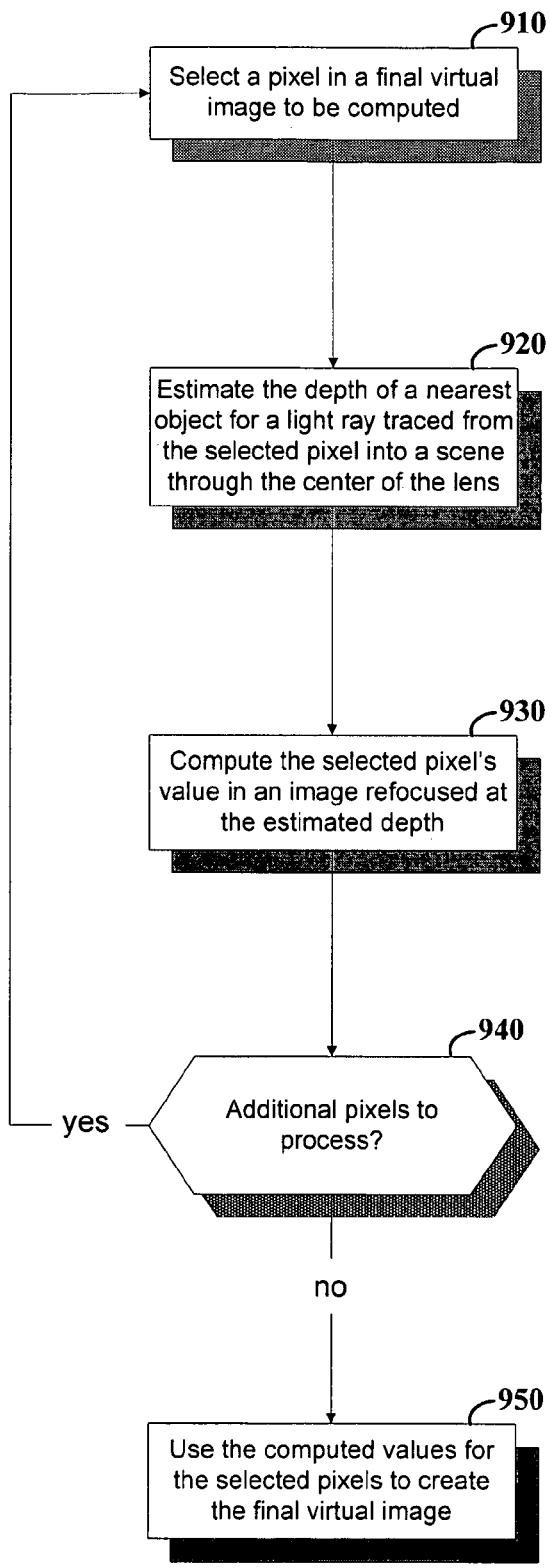
FIG. 9 is a process flow diagram for another approach to extending the depth of field in an image, according to another example embodiment of the present invention.

In other example embodiments of the present invention, the depth of field is extended by focusing each pixel on the depth of the closest object in that direction. FIG. 9 is a process flow diagram for extending the depth of field in an image, according to one such example embodiment. At block 910, a pixel is selected in a final virtual image to be computed. At block 920, the depth of a nearest object is estimated for a light ray (or set of light rays) traced from the selected pixel into a scene through the center of the lens.

At block 930, the selected pixel's value is computed in an image refocused at the estimated depth. If additional pixels are desirably processed at block 940, another pixel is selected at block 910 and the process continues at block 920 for the newly-selected pixel. When no additional pixels are desirably processed at block 940, the computed values for each selected pixel are used to create the final virtual image.

Figure 23:
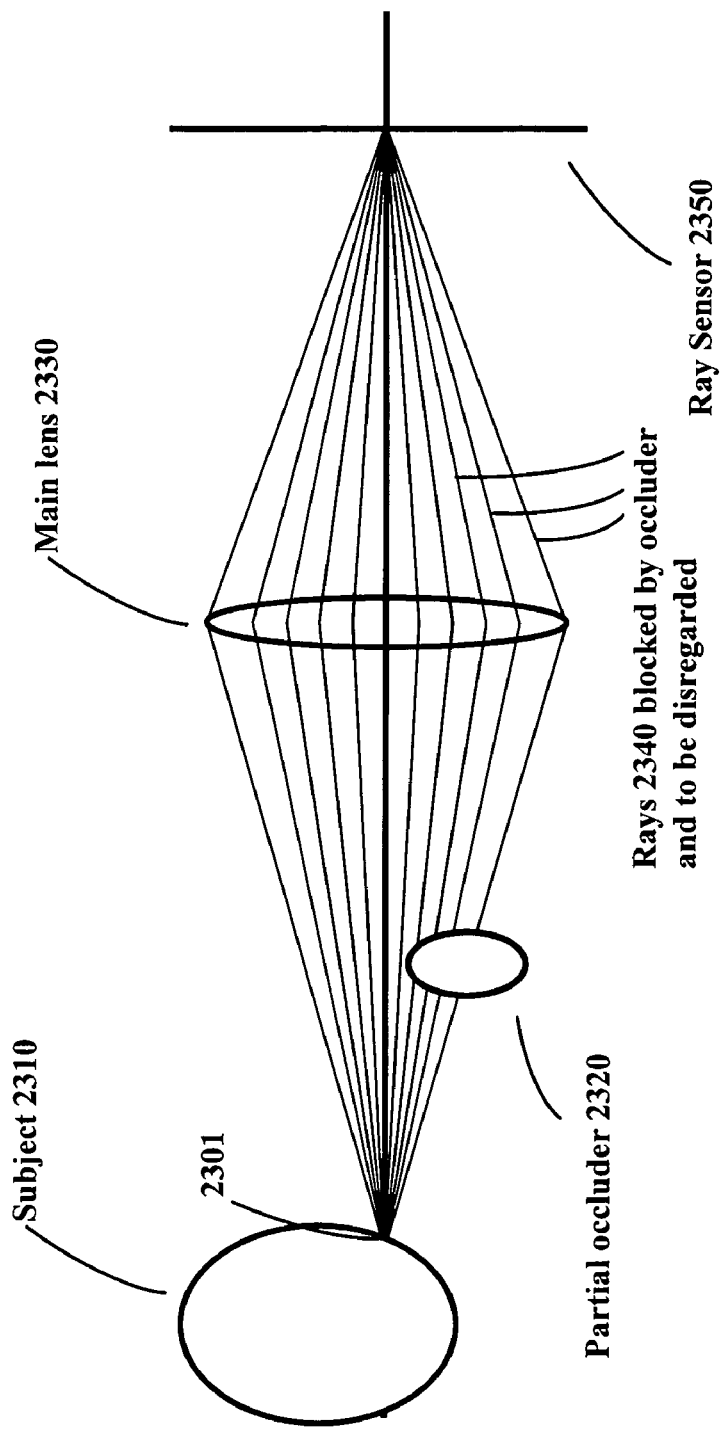
FIG. 23 shows a set of rays which pass through a desired focal point, according to another example embodiment of the present invention.

In some embodiments involving the extension of the depth of field, a value at each output pixel is computed by disregarding light rays that originate at depths closer than the depth of a desired object to mitigate or eliminate artifacts such as those generally referred to as "blooming" or "halo" artifacts around the borders of objects closer to the lens. By way of example, FIG. 23 illustrates the set of rays that pass through a desired focal point 2301 in the world on a subject of interest 2310. Some of these rays are occluded from the main lens by object 2320, and these correspond to the light rays 2340 that are detected by ray sensor 2350 but disregarded in computing an image value for point 2301. In some embodiments, rays to be disregarded are detected by a mismatch with the color of the central ray. In some embodiments the resulting pixel value is normalized by dividing by the fraction of rays that are not disregarded. These embodiments may be used in isolation or combination with each other and any other embodiments, including those directed to extending the depth of field.

As discussed above, light data is processed in accordance with various example embodiments to focus and/or correct images. A variety of approaches to the latter correction approach are discussed as follows. In some of these embodiments, aberrations are corrected by tracing rays through the actual optical elements of the optics (e.g., lens or lenses) used in capturing the rays, and mapping the traced rays to particular photosensors capturing the light. Light data is rearranged, using known defects exhibited by the optics as well as the known position of the sensors detecting the light.

Figure 15:
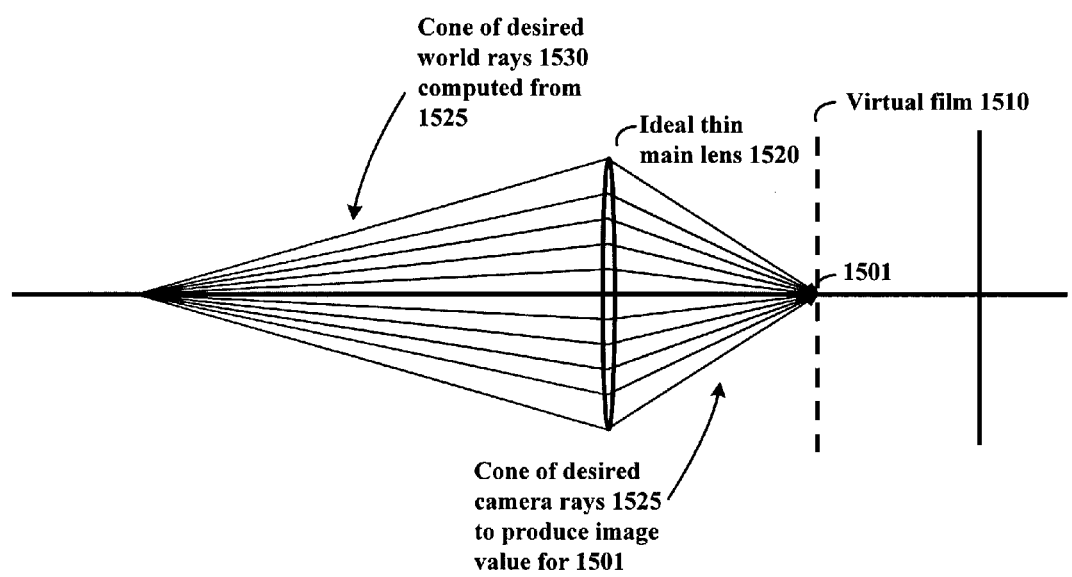
FIG. 15 illustrates an approach to the tracing of rays from a 3D point on a virtual film plane, according to another example embodiment of the present invention.

In one correction-type embodiment, the world of rays that contribute to each pixel as formed through idealized optics is computed for each pixel on a film of a synthesized photograph. In one implementation, these rays are computed by tracing rays from the virtual film location back through the ideal optics into the world. FIG. 15 illustrates an approach to the tracing of rays from a 3D point 1501 on a virtual film plane 1510 through an ideal thin main lens 1520 out into a cone of world rays 1530, in connection with one such example embodiment. In some implementations, the set of desired rays 1525 may not necessarily correspond to direction through a real lens, but may correspond to any set of rays that are to be weighted and summed to produce a desired image value.

Figure 16:
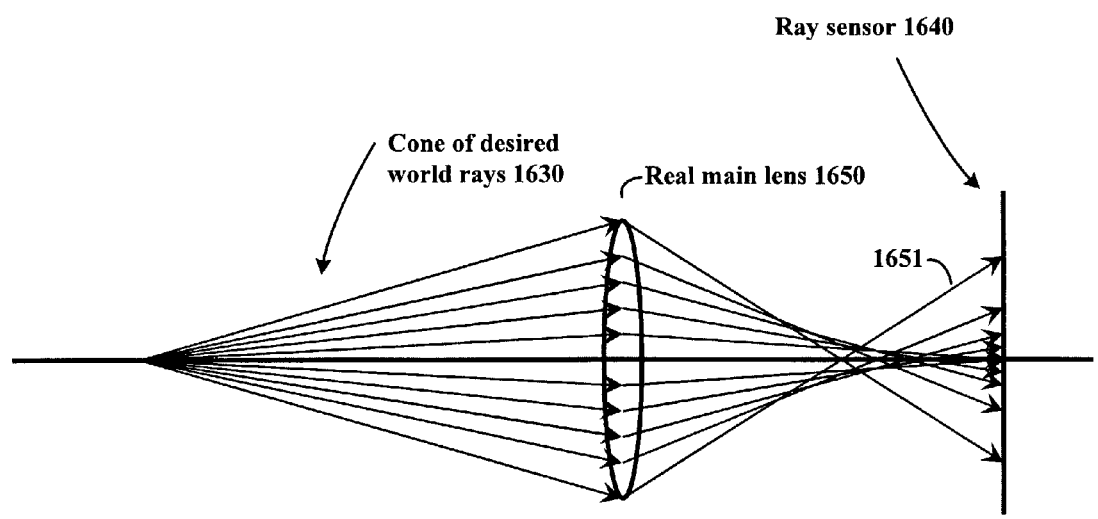
FIG. 16 shows an approach to finding the value of light, according to another example embodiment of the present invention.

FIG. 16 shows an approach to finding the value of light traveling along ideal rays for a particular application, in connection with another example embodiment. These values are computed by tracing desired ideal world rays 1630 through a real main lens 1650, having a single element with spherical interfaces, used to physically direct the real world light rays to the ray sensor 1640 at the time the rays are measured (detected). In this embodiment, the rays that ideally converge to a single 3D point (1601) do not converge, representing a defect of lenses with spherical interfaces called spherical aberration. The ray sensor 1640 provides individual values for each of the aberrated rays (such as 1651), which are used to correct for the spherical aberration.

Figure 17A:
FIG. 17A shows an ideal 512×512 photograph, according to another example embodiment of the present invention.
Figure 17B:
FIG. 17B shows an image that would be produced with an f/2 bi-convex spherical lens, according to another example embodiment of the present invention.
Figure 17C:
FIG. 17C shows an image computed using an image correction approach, according to another example embodiment of the present invention.

FIGS. 17A-17C illustrate example results using a computer simulation with an approach to lens correction. The image in FIG. 17A is an ideal 512×512 photograph (as seen through perfect optics). The image in FIG. 17B is an image that would be produced with a real f/2 bi-convex spherical lens, which has loss in contrast and blurring. The image in FIG. 17C is a photograph computed using an approach to image correction described above, using an optics and sensor arrangement facilitating 10×10 directional (u, v) resolution at each of 512×512 microlenses.

In another example embodiment of the present invention, chromatic aberrations are corrected in a main lens used to capture an image. Chromatic aberration is caused by the divergence of rays of light as they are physically directed through optics because of differences in the physical direction dependent on the wavelength of light. The incoming rays are traced through the actual optics, taking into account the wavelength-dependent refraction of light that occurs in the actual optics. In some applications, each color component of the system is traced separately based on the primary wavelength.

Figure 18A:
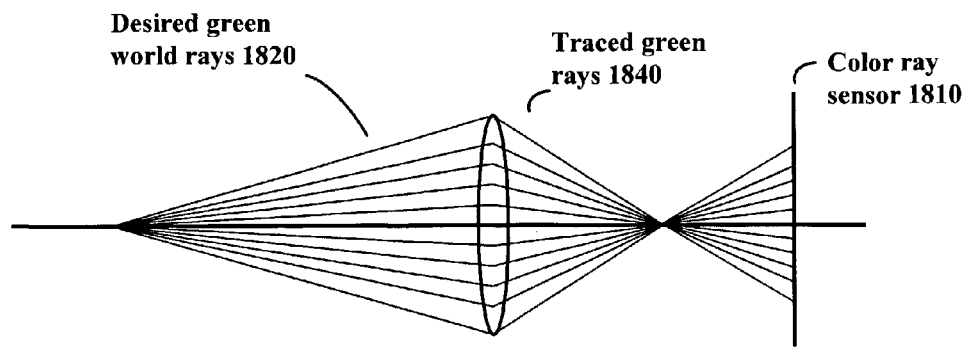
FIGS. 18A-18C illustrate the tracing of light rays common in color imaging systems, according to another example embodiment of the present invention.
Figure 18B:
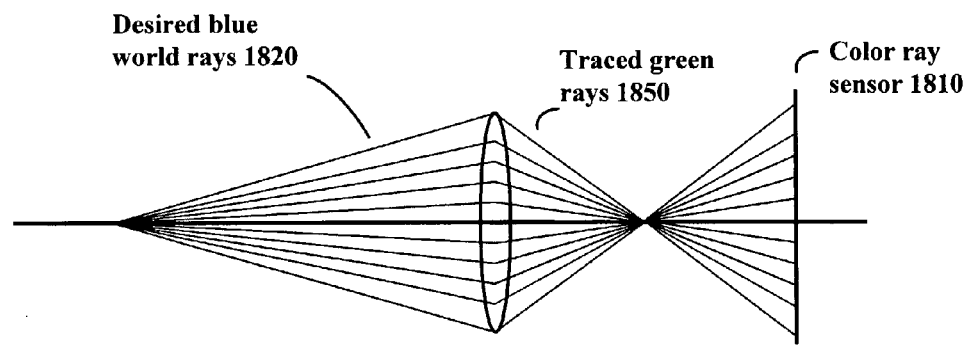
Figure 18C:
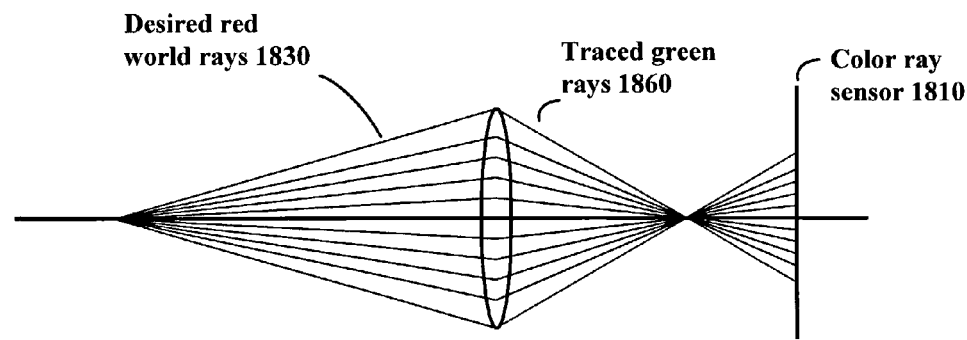

In another example embodiment, each of the red, green and blue components common in color imaging systems is traced separately, as illustrated in FIG. 18A. The green world light rays are computationally traced back into the imaging system to produce green rays 1830, and to determine where they intersect a color ray sensor 1810 and at what direction they intersect the color ray sensor 1810. Similarly, FIG. 18B illustrates computationally tracing the desired blue world light rays 1820, which are refracted to a greater extent than the green light rays. FIG. 18C illustrates computationally tracing the desired red world light rays 1830, which are refracted to a lesser extent than the green light rays. The values for each ray are computed from the values from the ray sensor 1810 using, for example, approaches discussed in connection with other example embodiments described herein. The light field values for each ray are integrated to calculate the corrected image value for each particular film pixel. For some applications, chromatic aberration is ameliorated by refocusing each color channel on the plane at which its wavelengths best come into focus.

The desired light rays may not converge exactly on one of the discrete ray values sampled by the ray sensor. In some embodiments, the value to be used for such rays is computed as a function of the discrete ray values. In some embodiments, this function corresponds to a weighted sum of the value of discrete rays in a neighborhood of the desired light ray. In some implementations, this weighted sum corresponds to a 4D convolution of the discrete sample values with a predetermined convolution kernel function. In other implementations, the weighting may correspond to a quadrilinear interpolation from the 16 nearest neighbors. In still other implementations, the weighting may correspond to a cubic or bicubic interpolation from the 16 nearest neighbors.

It is worth noting that example correction processes have been described in terms of ray-tracing for conceptual simplicity; a variety of other approaches are implemented with correction. In one embodiment, for each desired output pixel, the set of photosensor values that contribute are pre-computed along with their relative weights. As described above, these weights are a property of a number of factors that may include the optics, sensor, desired set of rays to be weighted and summed for each output pixel and desired light field reconstruction filter. These weights are pre-computed, selectively using ray-tracing, and stored. A corrected image is formed by weighting and adding the appropriate sensed light field values for each output pixel.

Figure 29:
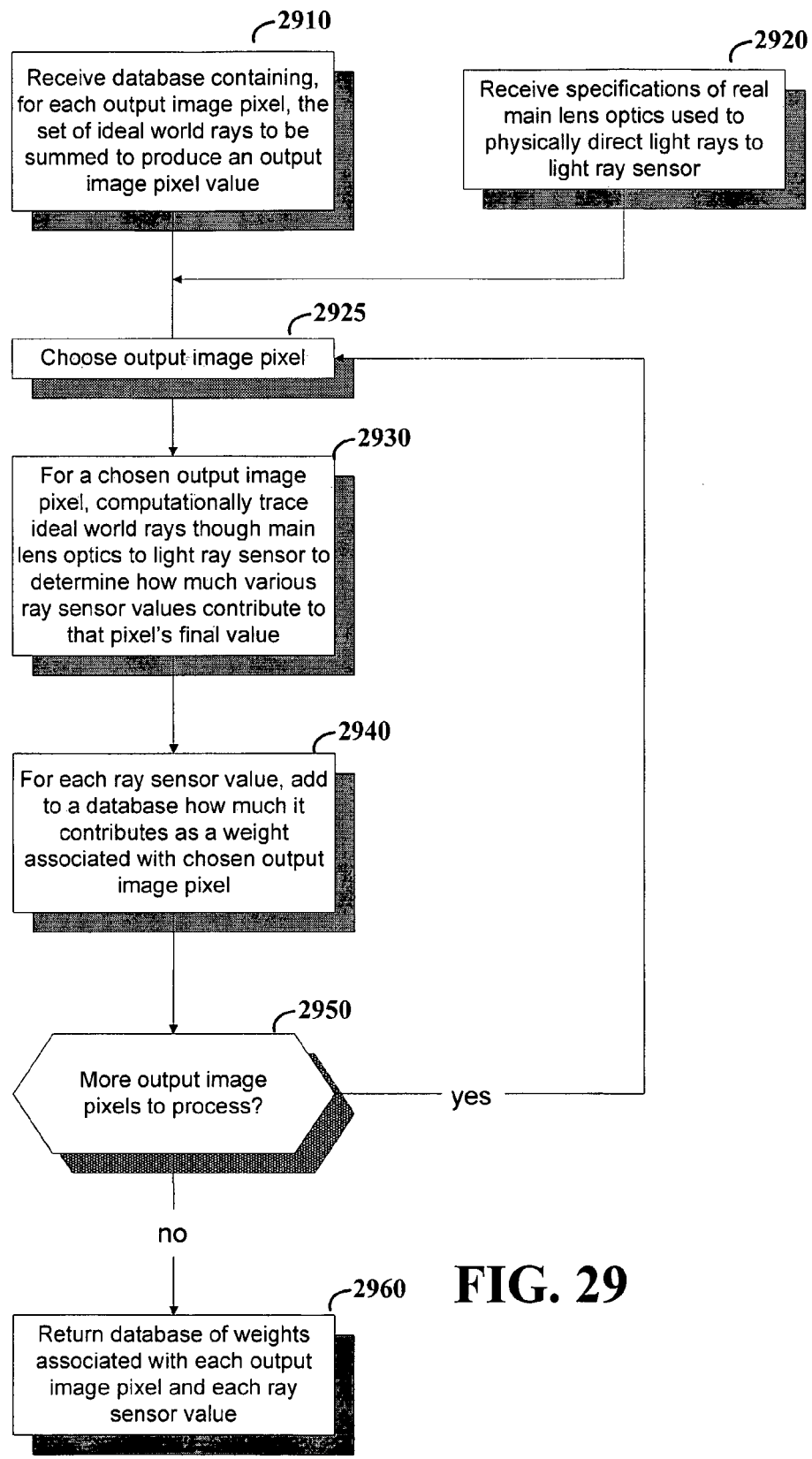
FIG. 29 is a process flow diagram for pre-computing a database of weights associated with each output image pixel and each ray sensor value, according to another example embodiment of the present invention.
Figure 30:
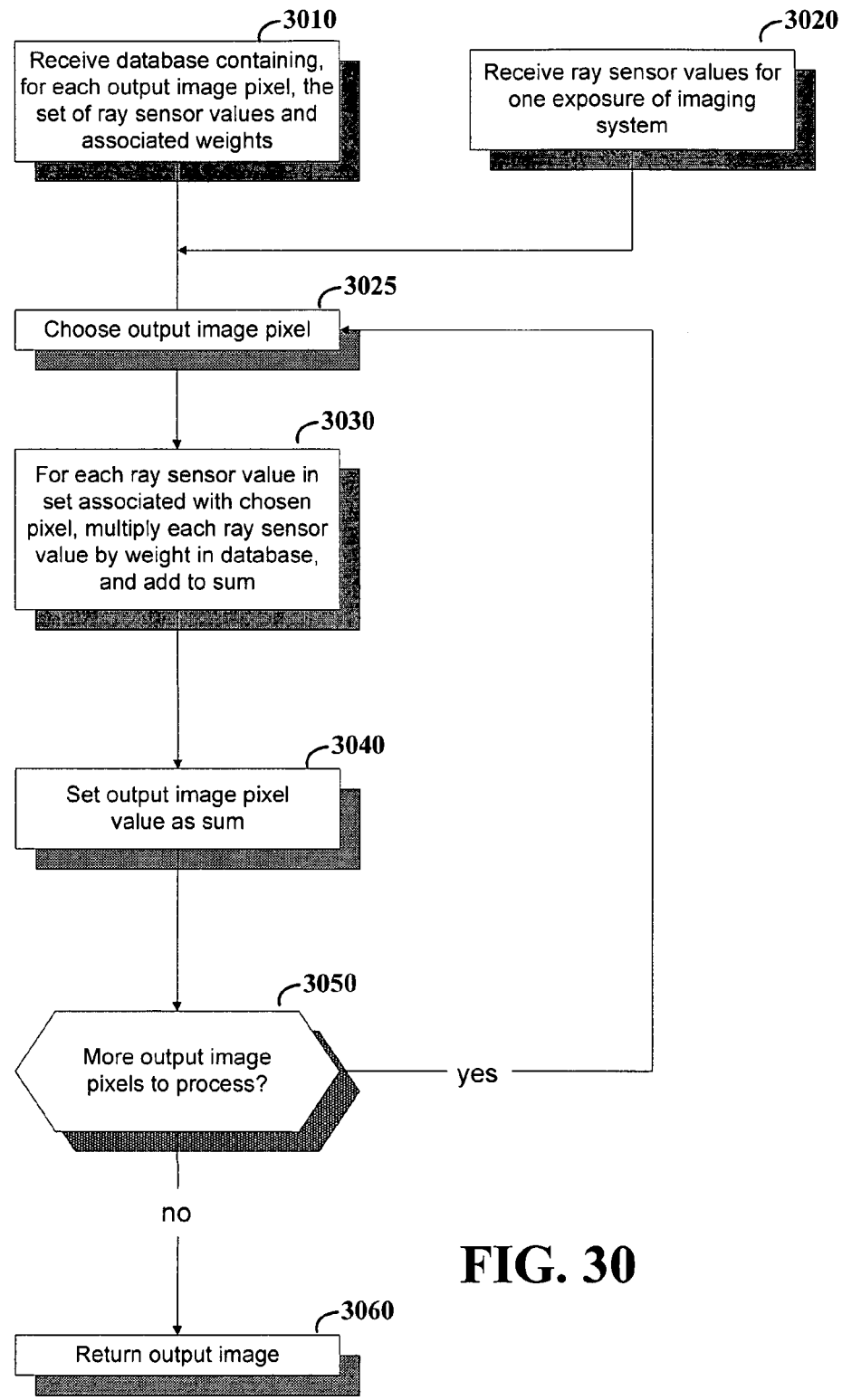
FIG. 30 is a process flow diagram for computing an output image using a database of weights, according to another example embodiment of the present invention.
Figure 31A:
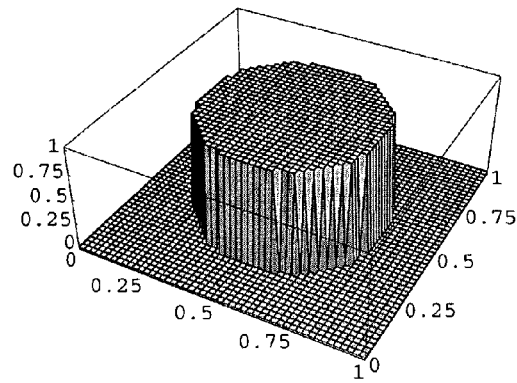
FIGS. 31A-D illustrate various scalar functions which are selectively implemented as a virtual aperture function, according to another example embodiment of the present invention.
Figure 31B:
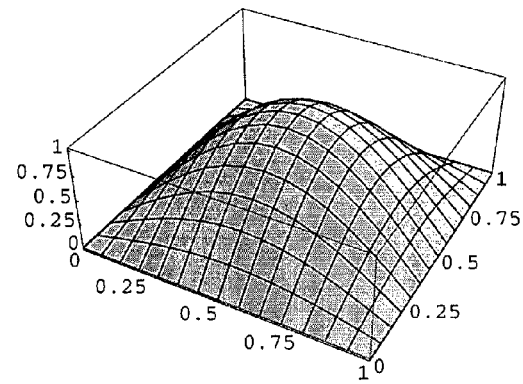
Figure 31C:
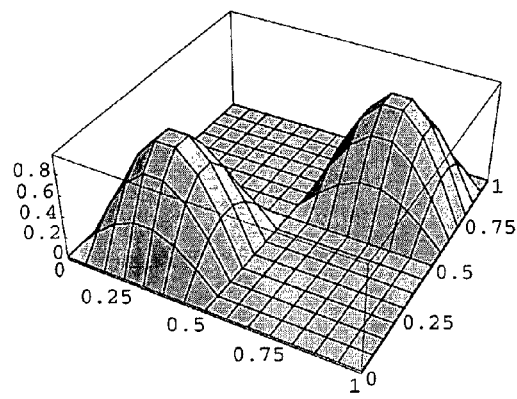
Figure 31D:
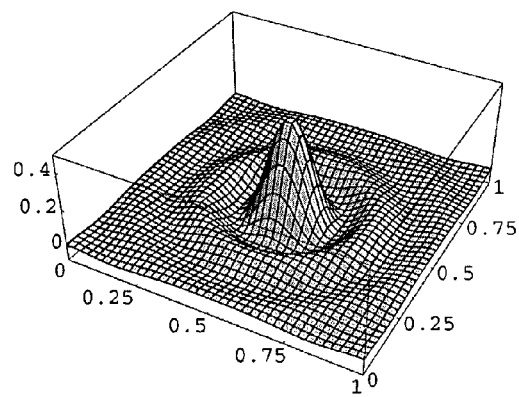

FIG. 29 and FIG. 30 illustrate other example embodiments for use in connection with the above correction approach. FIG. 29 is a process flow diagram for pre-computing a database of weights associated with ray (light) sensors and an output pixel value associated with each ray sensor. In the first two blocks 2910 and 2920, a data set (e.g., in a database) is received for a desired image formation process consisting of (for each output image pixel) a set of ideal world light rays to be summed to produce an output image pixel value, and a specification for real main lens optics used to physically direct light rays to a light ray sensor. At block 2925, an image pixel is chosen. For the output value of this pixel, the associated set of world rays is computationally traced at block 2930 through a virtual representation of the main lens optics to the ray sensor. This results in a set of weights to be applied to each ray sensor value to compute the output pixel value. These values are stored in an output database in block 2940. Block 2950 checks whether all pixels have been processed, returning to block 2925 if not. If all pixels have been processed, the final block 2960 saves the completed database.

FIG. 30 is a flow diagram for a process that computes an output image using a database of weights that may have been computed by a process as in FIG. 29. In block 3010 and 3020, the process receives the database and a set of ray sensor values captured with the main lens optics used in computing the database. At block 3025, a pixel in the output image is selected, so that its final image value may be computed. For the selected pixel, block 3030 uses the database to find the set of ray sensor that contributes and their weights. In block 3040, each sensor value given in 3020 is weighted and added to a sum for that image pixel value. At block 3050, a check is performed to see whether all image pixels have been processed. If not, the process returns to block 3025, and if so, the output image is saved at block 3060.

Figure 20:
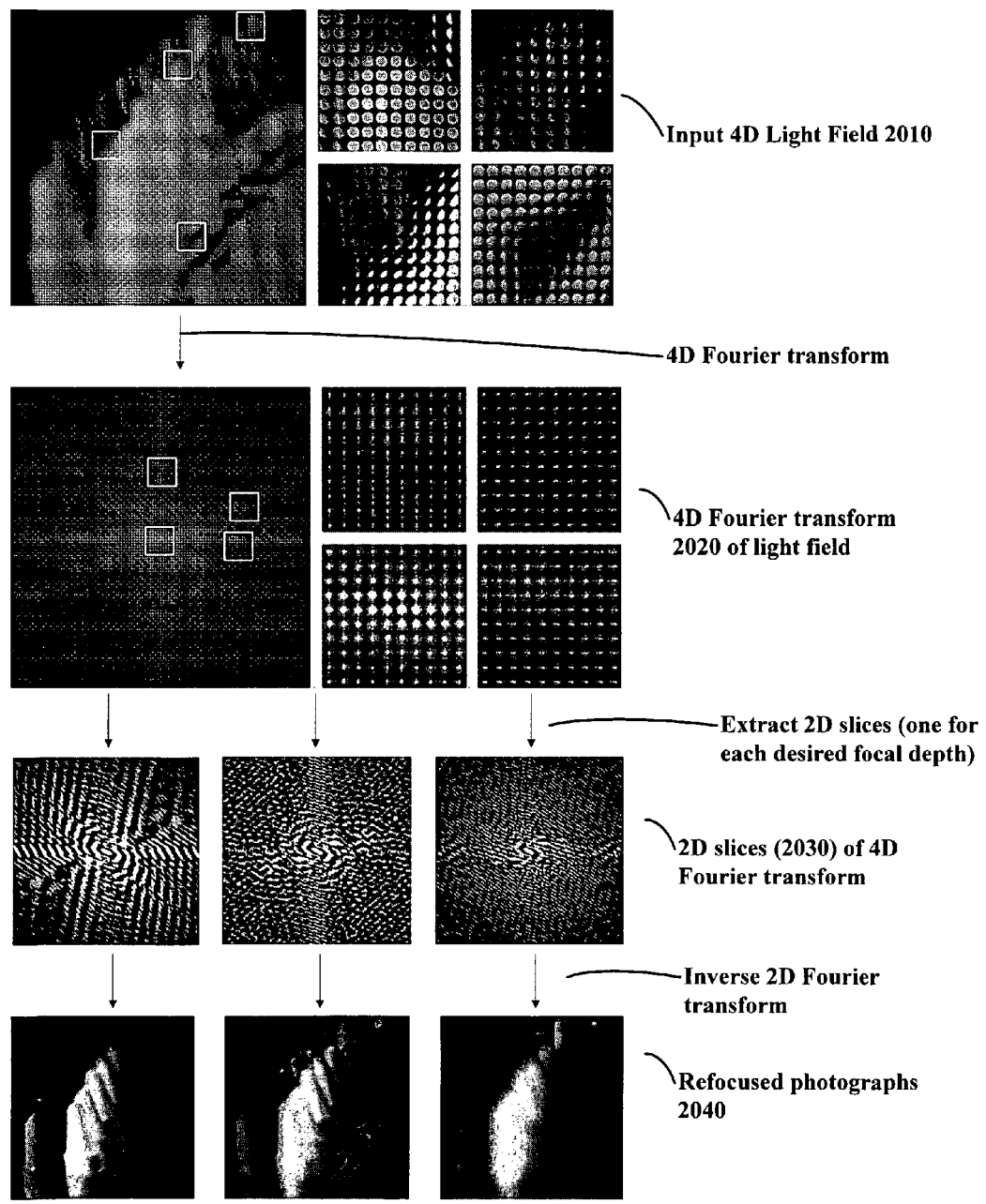
FIG. 20 is a process flow diagram of computational approaches to refocusing in a Fourier domain, according to another example embodiment of the present invention.

In a variety of example embodiments, light data is processed in the frequency domain, with certain approaches directed to computational approaches to refocusing that operate in the Fourier domain. FIG. 20 is a flow diagram illustrating one such approach, in connection with another example embodiment. The input to the algorithm is a discrete 4D light field 2010, which we will refer to as $L(s,t,u,v)$, representing the ray starting at $(u, v)$ on a main lens and terminating at $(s, t)$ on a microlens plane (e.g., from the main lens 110 and terminating at a plane of the microlens array 120 of FIG. 1). The first step is to compute the discrete 4D Fourier transform 2020 of the light field. The 4D Fourier transform value at $(k_s, k_t, k_u, k_v)$, let us call this value $M(k_s, k_t, k_u, k_v)$ is defined by the following equation:

$$M(k_s,k_t,k_u,k_v)=\iiiint L(s,t,u,v)\exp(-2\pi\sqrt{-1}\cdot(sk_s+tk_t+uk_u+vk_v))dsdtdudv \quad (1)$$

where the exp function is the exponential function, $\exp(x)=e^x$. In some embodiments the discrete light field is sampled on a rectilinear grid in the 4D space, and the Fourier transform is computed with the Fast Fourier Transform (FFT) algorithm.

The next step, which is executed once for each depth at which we wish to refocus the image, is to extract appropriate 2D slices 2030 of the 4D Fourier transform, and compute the inverse 2D Fourier transforms of the extracted slices, which are photographs focused at different depths 2040. The inverse 2D Fourier transform, $g(x, y)$, for a function $G(k_x, k_y)$ is defined by the following equation:

$$g(x,y)=\iint G(k_x,k_y)\exp(2\pi\sqrt{-1}\cdot(xk_x+yk_y))dk_xdk_y. \quad (2)$$

The values on the extracted 2D slice are determined by the depth at which we want to refocus. Considering the conjugate plane (on the image-side of the lens) for the desired world focal plane, when the separation between this conjugate plane and the main lens is D and the separation between the microlens plane and the main lens is F, then the value of the extracted 2D slice at coordinates $(k_x,k_y)$ is given by $$G(k_x,k_y)=1/F^2 \cdot M(k_x(1-D/F),k_y(1-D/F),k_xD/F,k_yD/F). \quad (3)$$

Using various approaches, artifacts that result from discretization, resampling and Fourier transformation are selectively ameliorated. In general signal-processing terms, when we sample a signal it is replicated periodically in the dual domain. When we reconstruct this sampled signal with convolution, it is multiplied in the dual domain by the Fourier transform of the convolution filter. In this regard, the original, central replica is isolated, eliminating all other replicas. A desirable filter is a 4D sin c function, $\sin c(s)\sin c(t)\sin c(u)\sin c(v)$, where $\sin c(x)=\sin(\pi x)/(\pi x)$; however, this function has infinite extent.

In various approaches, finite-extent filters are used with frequency-domain processing; such filters may exhibit defects, which are selectively mitigated. FIG. 21A illustrate these defects with respect to a specific 1D filter, with corresponding discussion below directed to mitigation or such defects. FIG. 21A represents a triangle filter approach implemented with in linear interpolation in 1D (or as the basis for a 4D quadrilinear filter). FIG. 21B shows the Fourier transform of the triangle filter approach, which is not of unit value within the band-limit (see 2010), and which gradually decays to smaller fractional values as the frequency increases. In addition, the filter is not truly band-limited, containing energy at frequencies outside the desired stop-band (2020).

The first defect described above leads to "rolloff artifacts," which can lead to a darkening of the borders of computed photographs. Decay in the filter's frequency spectrum with increasing frequency means that the spatial light field values, which are modulated by this spectrum, also "roll off" to fractional values towards the edges.

The second defect described above involves aliasing artifacts in computed photographs, which are related to energy at frequencies above the band-limit. The non-zero energy that extends beyond the band-limit means that the periodic replicas are not fully eliminated, leading to two kinds of aliasing. First, the replicas that appear parallel to the slicing plane appear as 2D replicas of the image encroaching on the borders of the final photograph. Second, the replicas positioned perpendicular to this plane are projected and summed onto the image plane, creating ghosting and loss of contrast.

In an example embodiment, correction for rolloff-type defects as described above is eliminated by multiplying the input light field by the reciprocal of the filter's inverse Fourier spectrum, to nullify the effect introduced during resampling. In this example embodiment, multiplication is performed prior to taking the 4D Fourier transform in the pre-processing step of the algorithm. While it corrects rolloff error, pre-multiplication may accentuate the energy of the light field near its borders, maximizing the energy that folds back into the desired field of view as aliasing.

Three methods of suppressing aliasing artifacts—oversampling, superior filtering and zero-padding—are used individually or in combination in various example embodiments described below. Oversampling within the extracted 2D slice increases the replication period in the spatial domain. This means that less energy in the tails of the in-plane replicas will fall within the borders of the final photograph. Increasing the sampling rate in one domain leads to an increase in the field of view in the other domain. Aliasing energy from neighboring replicas falls into these outer regions, which is cropped away to isolate the original, central image of interest.

Another approach to mitigating aliasing is directed to a finite-extent filter that approximates a perfect spectrum (as would be exhibited via use of an ideal filter) as closely as possible. In an example embodiment, a 4D Kaiser-Bessel separable function, $kb4(s,t,u,v)=kb(s)kb(t)kb(u)kb(v)$, is used as the filter, where $$kb(x)=1/W \cdot I_0(P \cdot \sqrt{1-(2x/W)^2}) \tag{4}$$

In this equation, $I_0$ is the standard zero-order modified Kaiser-Bessel function of the first kind, W is the width of the desired filter, and P is a parameter that depends on W. In this example embodiment, W values are 5, 4.5, 4.0, 3.5, 3.0, 2.5, 2.0 and 1.5, and the P values are, respectively, 7.4302, 6.6291, 5.7567, 4.9107, 4.2054, 3.3800, 2.3934, and 1.9980. For general information regarding aliasing, and for specific information regarding approaches to mitigating aliasing in connection with one or more example embodiments of the present invention, reference may be made to Jackson J. I., Meyer C. H., Nishimura, D. G. and Macovski, A., 1997, Selection of convolution function for Fourier inversion using gridding. IEEE Transactions on Medical Imaging, 10, 3, 473-478, which is fully incorporated herein by reference. In one implementation, widths "W" of less than about 2.5 are implemented to achieve desirable image quality.

In another example embodiment, aliasing is mitigated by padding a light field with a small border of zero values before pre-multiplication and taking its Fourier transform. This pushes energy slightly further from the borders, and minimizes the amplification of aliasing energy by the pre-multiplication for rolloff correction.

Figure 22:
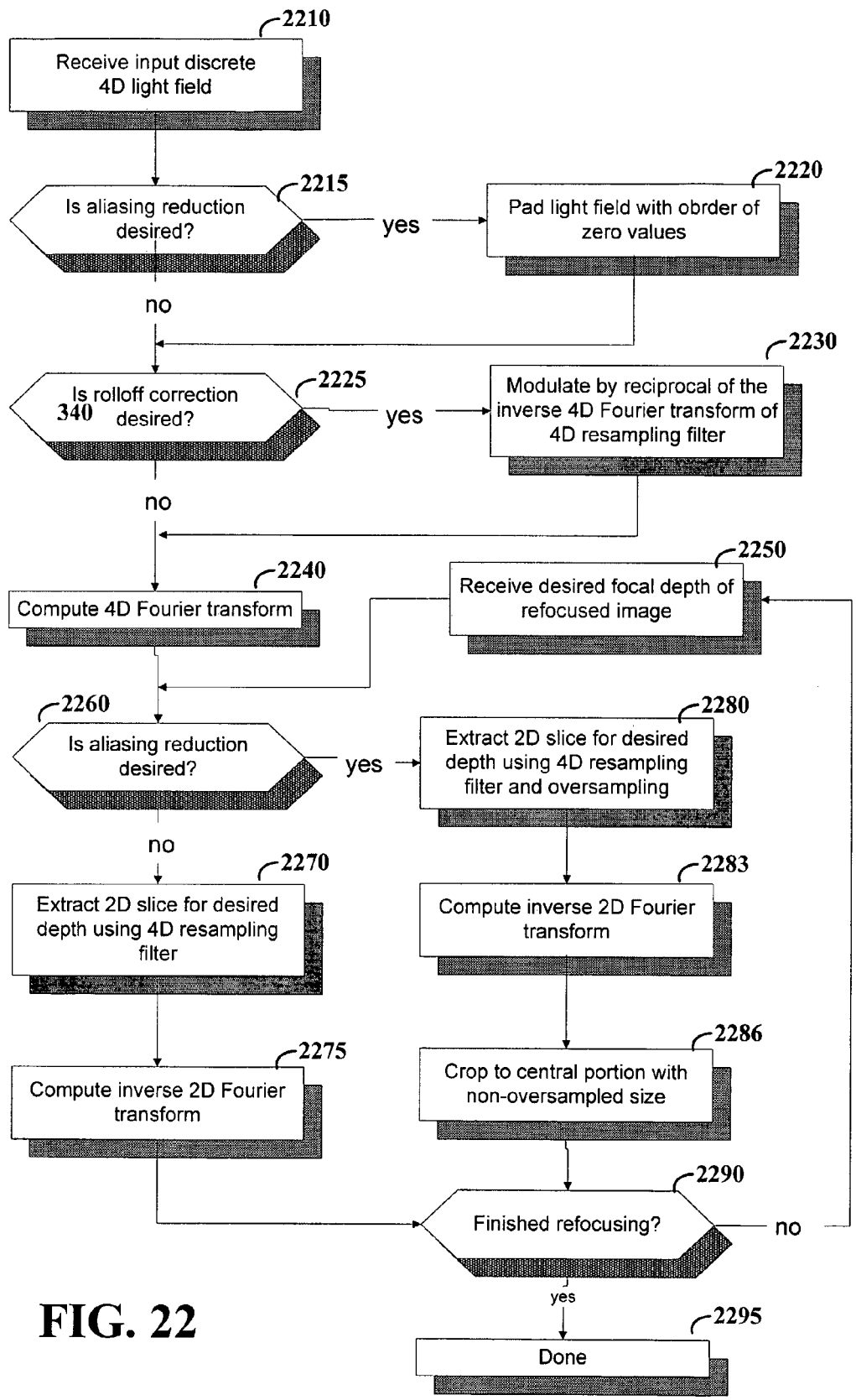
FIG. 22 is process flow diagram of an approach to refocusing in a frequency domain, according to another example embodiment of the present invention.

FIG. 22 is a flow diagram showing an approach to refocusing in the frequency domain using various corrections described above, according to another example embodiment of the present invention. At block 2210, a discrete 4D light field is received. In the pre-processing phase, which occurs once per input light field, block 2215 checks if aliasing reduction is desired, and if so executes block 2220, which pads the light field with a small border (e.g., 5% of the width in that dimension) of zero values. At block 2225 a check is performed to determine whether rolloff correction is desired, and if so, the light field is modulated at block 2230 by the reciprocal of the Fourier transform of the resampling filter. In the final block of the pre-processing phase, the 4D Fourier transform of the light field is computed at block 2240.

In the refocusing phase, which occurs once per desired focal depth, the process receives a desired focal depth of refocused image at block 2250, such as through the direction of a user. At block 2260, a check is performed to determine whether aliasing reduction is desired. If not, block 2270 extracts a 2D slice of the Fourier transform of the light field, with a desired 4D rsampling filter, where the trajectory of the 2D slice corresponds to the desired focal depth; and block 2275 computes an inverse 2D Fourier transform of the extracted slice and moves to block 2290. If aliasing reduction was desired at block 2260, the process moves to block 2280, at which a 2D slice with desired 4D resampling filter and oversampling (e.g. 2× oversampling in each of the two dimensions) is extracted. At block 2283, the slice's inverse 2D Fourier transform is computed, and the resulting image is cropped to the original size without oversampling at block 2286, after which the process moves to block 2290. At block 2290, a check is performed to determine whether refocusing is complete. If not, another focal depth is chosen at block 2250 and the process proceeds as described above. If refocusing is complete, the process exits at block 2295.

The asymptotic computational complexity of this frequency-domain algorithm is less than refocusing by explicitly summing rays as described for the alternate embodiment above. Assume that the input discrete light field has N samples in each of its four dimensions. Then the computational complexity of the algorithm that explicitly sums rays is $O(N^4)$ for refocusing at each new depth. The computational complexity of the frequency-domain algorithm is $O(N^2 \log N)$ for refocusing at each new depth, dominated by the cost of the inverse 2D Fourier transform. However, the pre-processing step costs $O(N^4 \log N)$ for each new light field dataset.

In another example embodiment, the captured light rays are optically filtered. Although not limited to such applications, some examples of such filters are neutral density filters, color filters, polarizing filters. Any filter currently existing or that may be developed in the future may be used to effect a desired filtering of the rays of light. In one implementation, the light rays are optically filtered in groups or individually, so that each group or individual ray is filtered differently. In another implementation, a filtering is applied by the use of a spatially-varying filter attached to a main lens. In one example application, a gradient filter such as a neutral-density gradient filter is used to filter light. In another implementation, spatially varying filters are used in front of one or more of a ray sensor, a microlens array or a photosensor array. Referring to FIG. 1 by way of example, one or more such filters are selectively placed in front of one or more of the main lens 110, microlens array 120 and photosensor array 130.

In another example embodiment of the present invention, a computational component such as a processor is programmed to selectively choose rays to combine in computing output pixels in order to effect a desired net filtering for that pixel value. By way of example, consider embodiments involving an optical neutral gradient density filter at the main lens, each image of the lens aperture that appears under a microlens is weighted by the filter gradient across its extent. In one implementation, output images are computed by selecting a photosensor under each microlens at the point of the gradient that matches the desired level of neutral-density filtering for that output image pixel. For example, to produce an image in which every pixel is filtered to a large extent, every pixel value is set to the value of the photosensor under the corresponding microlens that is at the extreme end of the gradient corresponding to maximum filtering.

Figure 2:
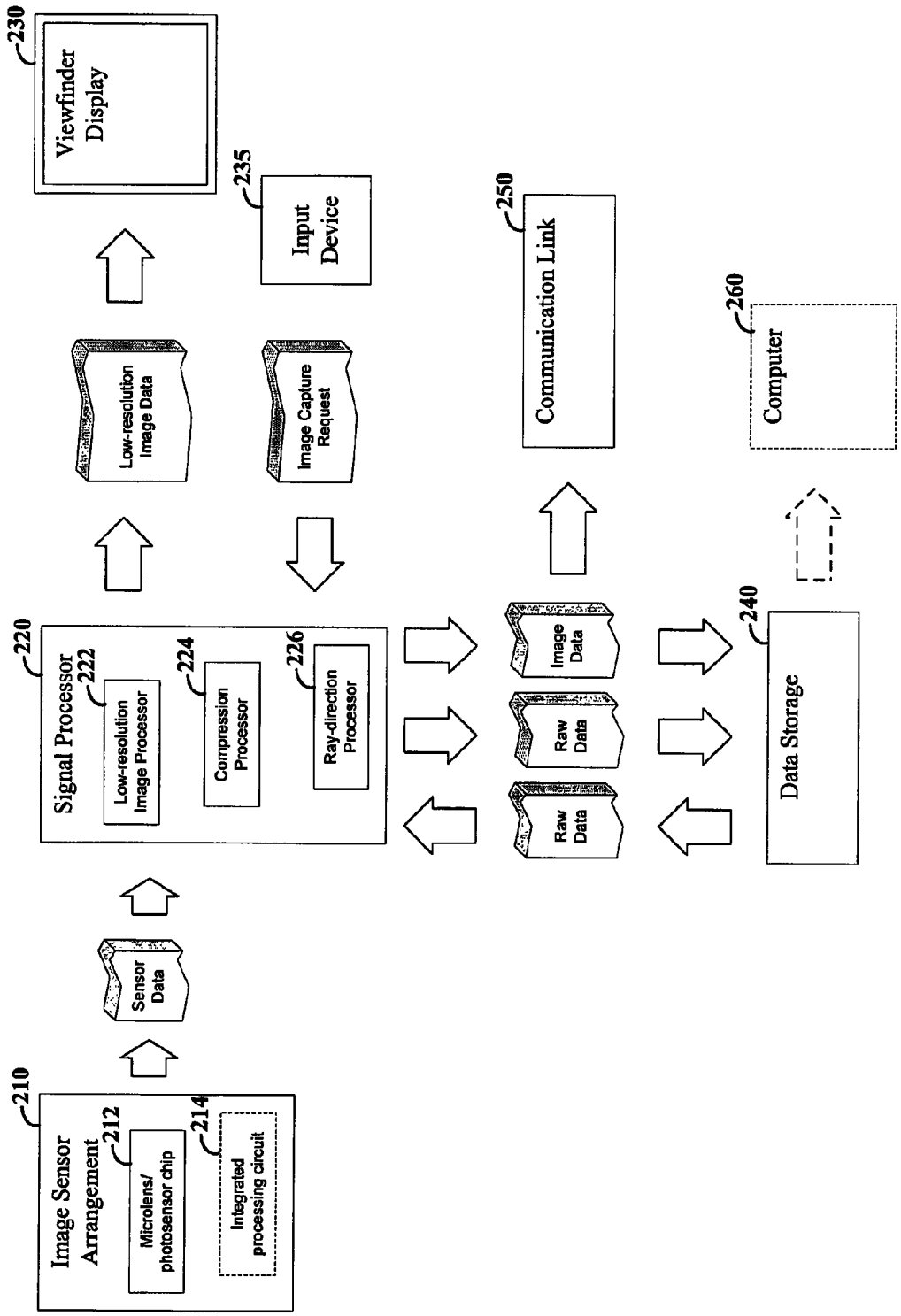
FIG. 2 is an optical imaging device, according to another example embodiment of the present invention.

FIG. 2 is a data-flow diagram showing an approach to processing images in connection with other example embodiments of the present invention. An image sensor arrangement 210 collects image data using microlens/photosensor chip arrangement 212 in a manner similar, for example, to the microlens array 120 and photosensor array 130 shown in FIG. 1 and described above. The image sensor arrangement 210 optionally includes an integrated processing circuit 214 bearing certain processing circuitry to prepare collected image data for transfer.

Sensor data created at the image sensor arrangement 210 is passed to a signal processor 220. The signal processor includes a low-resolution image processor 222 and one or both of a compression processor 224 and a (light) ray-direction processor 226; each of these processors is selectively implemented separately or functionally with a common processor, depending upon the application. Furthermore, each of the processors shown in FIG. 2 is selectively programmed with one or more processing functions described in connection with other figures or elsewhere herein. The signal processor 220 is optionally implemented in a common device or component with the image sensor arrangement 210, such as on a common circuit and/or in a common image device.

The low-resolution image processor 222 uses sensor data received from the image sensor arrangement 210 to generate low-resolution image data, which is sent to a viewfinder display 230. An input device 235, such as a pushbutton on a camera or video camera, sends an image capture request to the signal processor 220 requesting, for example, the capture of a particular image displayed in the viewfinder display 230 and/or to initiate video imaging where so implemented.

In response to the image capture request or as otherwise directed, the signal processor 220 uses the sensor data captured by the image sensor arrangement 210 to generate processed sensor data. In some applications, the compression processor 224 is implemented to generate compressed raw data for transfer to a data storage arrangement 240 (e.g., memory). Such raw data is then selectively processed at the signal processor 220 and/or at an external computer 260 or other processing device, implementing ray-direction processing such as that implemented with the ray-direction processor 226, which is discussed further below.

In certain applications, the ray-direction processor 226 is implemented to process the sensor data received at the signal processor 220 to rearrange the sensor data for use in generating focused and/or corrected image data. The ray-direction processor 226 uses one or both of sensor data received from the image sensor arrangement 210 and raw data sent to the data storage arrangement 240. In these applications, the ray-direction processor 226 uses ray-mapping characteristics of the particular imaging device (e.g., camera, video camera or mobile telephone) in which the image sensor arrangement 210 is implemented to determine a rearrangement of light rays sensed with the microlens/photosensor chip 212. Image data created with the ray-direction processor 226 is sent to the data storage arrangement 240 and/or to a communication link 250 for use in a variety of applications, such as in streaming image data or otherwise sending image data to a remote location.

In some applications, the integrated processing circuit 214 includes some or all of the processing functionality of the signal processor 220 by implementing, for example, a CMOS-type processor or other processor with appropriate functionality. For instance, the low-resolution image processor 222 is selectively included with the integrated processing circuit 214, with the low-resolution image data sent directly to the viewfinder display 230 from the image sensor arrangement 210. Similarly, the compression processor 224, or functionality similar thereto, is selectively implemented with the integrated processing circuit 214.

In some applications, computation of final images may be performed on the integrated processing circuit 214 (e.g. in some digital still cameras that output only final images). In other applications, the image sensor arrangement 210 may simply transmit the raw light ray data, or a compressed version of these data, to an external computational device, such as a desktop computer. Computation of final images from these data is then performed on the external device.

Figure 3:
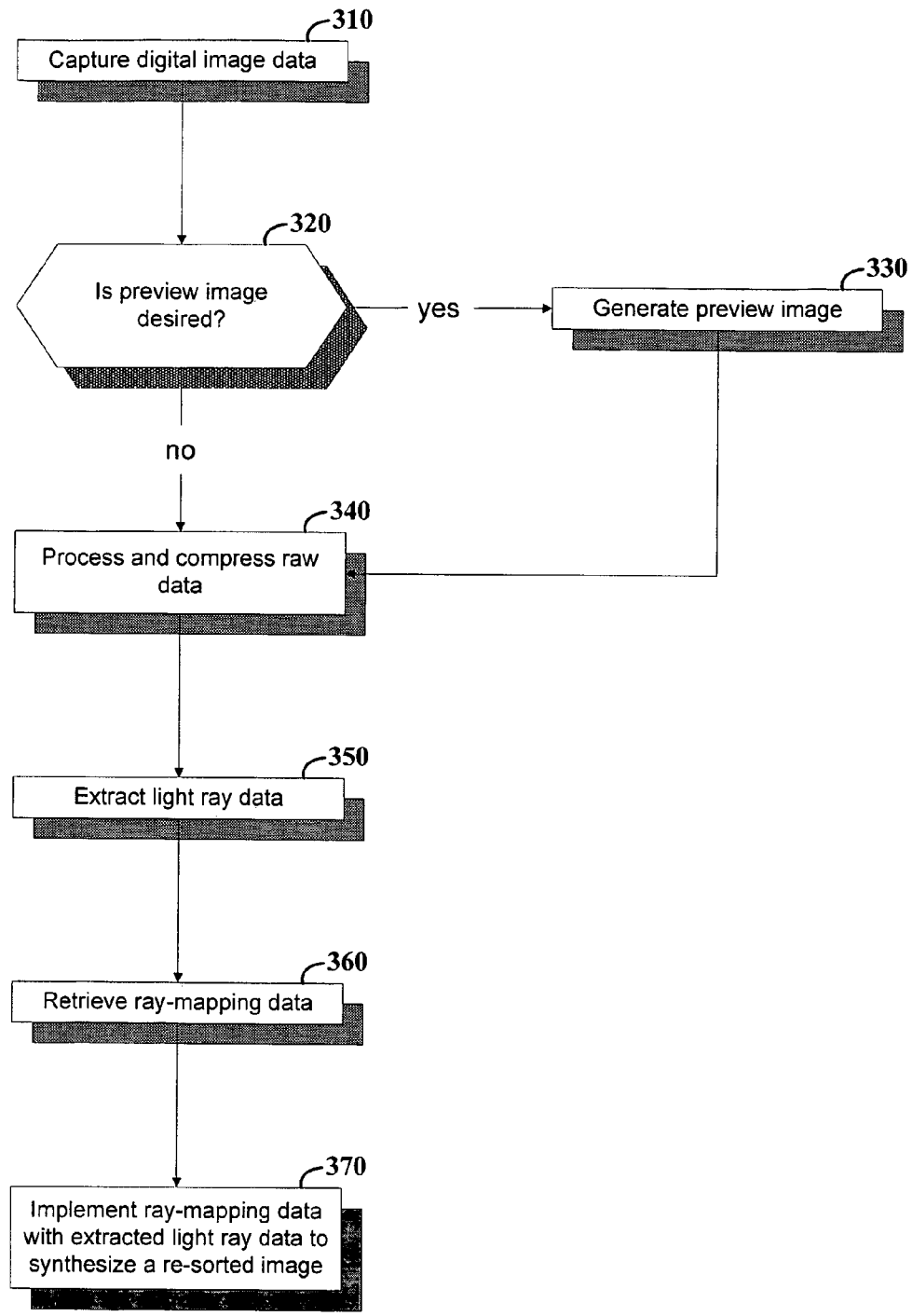
FIG. 3 is a process flow diagram for image processing, according to another example embodiment of the present invention.

FIG. 3 is a flow diagram for a method for processing image data, according to another example embodiment of the present invention. At block 310, image data is captured at a camera or other imaging device, using a main lens or a lens stack with a microlens/photosensor array such as that shown in FIG. 1. If a preview image is desired at block 320, the preview image is generated at block 330 using, for example, a viewfinder or other type of display. The preview image is displayed, for example, in a viewfinder of a camera or video camera, using a subset of the captured image data.

Raw data from the photosensor array is processed and compressed for use at block 340. Light ray data is extracted from the processed and compressed data at block 350. This extraction involves, for example, detecting a bundle or set of light rays incident upon a particular photosensor in the photosensor array. Ray mapping data is retrieved at block 360 for the imaging arrangement in which the image data is captured. The ray-mapping data and the extracted light ray data is used to synthesize a re-sorted image at block 370. For example, the extraction, mapping and synthesis blocks 350-370 are selectively implemented by determining a bundle of light rays for a particular pixel of a scene for which the light rays were collected, and integrating the energy of the light rays to synthesize a value for the particular pixel. In some applications, the ray mapping data is used to trace light rays for each particular pixel through actual lenses used to acquire the image data. For example, by determining an appropriate set of rays to add together in order to focus upon a selected subject at a particular focal depth at block 370, the rays can be re-sorted to arrive at a focused image. Similarly, by determining a proper arrangement of rays to correct for conditions such as lens aberrations in the imaging device, the rays can be re-sorted to generate an image relatively free of characteristics relating to the aberrations or other condition.

A variety of approaches are selectively used to generate preview images for camera-type and other applications. FIG. 4 is a process flow diagram for generating such a preview image, according to another example embodiment of the present invention. The approach shown in FIG. 4 and discussed below may be implemented, for example, in connection with the generation of a preview image at block 330 of FIG. 3.

A preview instruction with raw sensor image data is received at block 410. At block 420, a center pixel is selected from each microlens image in the raw sensor image data. The selected center pixels are collected to form a high depth-of-field image at block 430. At block 440, the high depth-of-field image is downsampled to a resolution amenable for use in a viewfinder display. Referring to FIG. 2 by way of example, such downsampling is selectively performed at one or more of the image sensor arrangement 210 or the signal processor 220. The generated preview image data is sent to the viewfinder display at block 450, and at block 460, the viewfinder displays an image with the preview image data.

Figure 5:
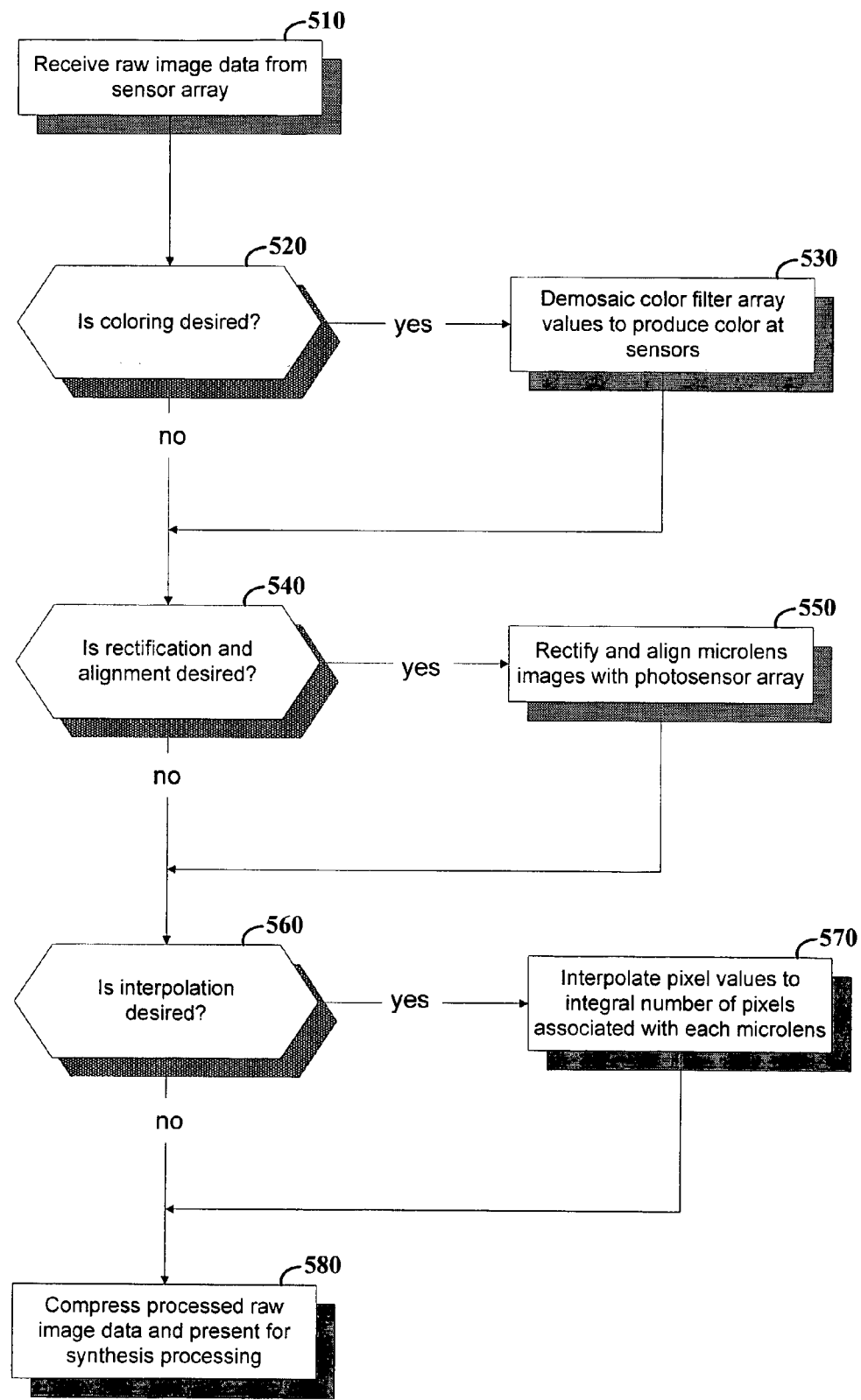
FIG. 5 is a process flow diagram for processing and compressing image data, according to another example embodiment of the present invention.

FIG. 5 is a process flow diagram for processing and compressing image data, according to another example embodiment of the present invention. The approach shown in FIG. 5 and discussed below may be implemented, for example, in connection with the processing and compressing of image data at block 340 of FIG. 3. When implemented with an arrangement as shown in FIG. 2, the approach shown in FIG. 5 may, for example, be implemented at one or both of the image sensor arrangement 210 and the signal processor 220.

At block 510, raw image data is received from a sensor array. If coloring is desired at block 520, color filter array values are demosiaced at block 530 to produce color at the sensors. If rectification and alignment is desired at block 540, microlens images are rectified and aligned with the photosensor array at block 550. If interpolation is desired at block 560, pixel values are interpolated at block 570 to an integral number of pixels associated with each microlens. At block 580, the processed raw image data is compressed and presented for synthesis processing (e.g., to form a refocused and/or corrected image).

Figure 6:
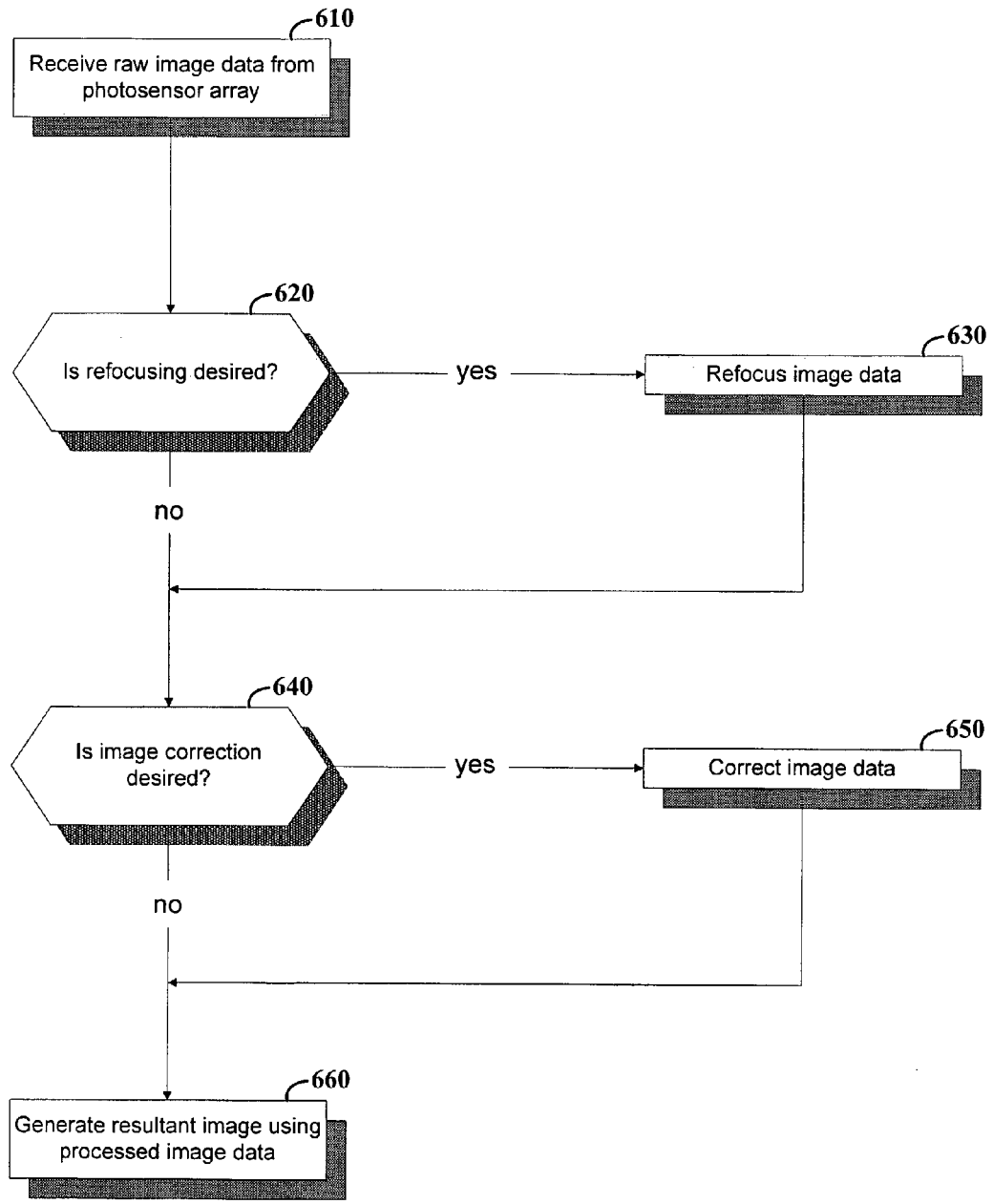
FIG. 6 is a process flow diagram for image synthesis, according to another example embodiment of the present invention.

FIG. 6 is a process flow diagram for image synthesis, according to another example embodiment of the present invention. The approach shown in FIG. 6 and discussed below may be implemented, for example, in connection with the image synthesis approach shown at block 370 of FIG. 3 and discussed further below.

At block 610, raw image data is received from a photosensor array. If refocusing is desired at block 620, image data is refocused at block 630 using, e.g., approaches discussed herein for selectively re-sorting light represented by the raw image data. If image correction is desired at block 640, image data is corrected at block 650. In various applications, image correction at block 650 is carried out before or concurrently with refocusing at block 630 in applications where both refocusing and image correction is desirable. A resultant image is generated at block 660 using processed image data including refocused and corrected data, where applicable.

Figure 7:
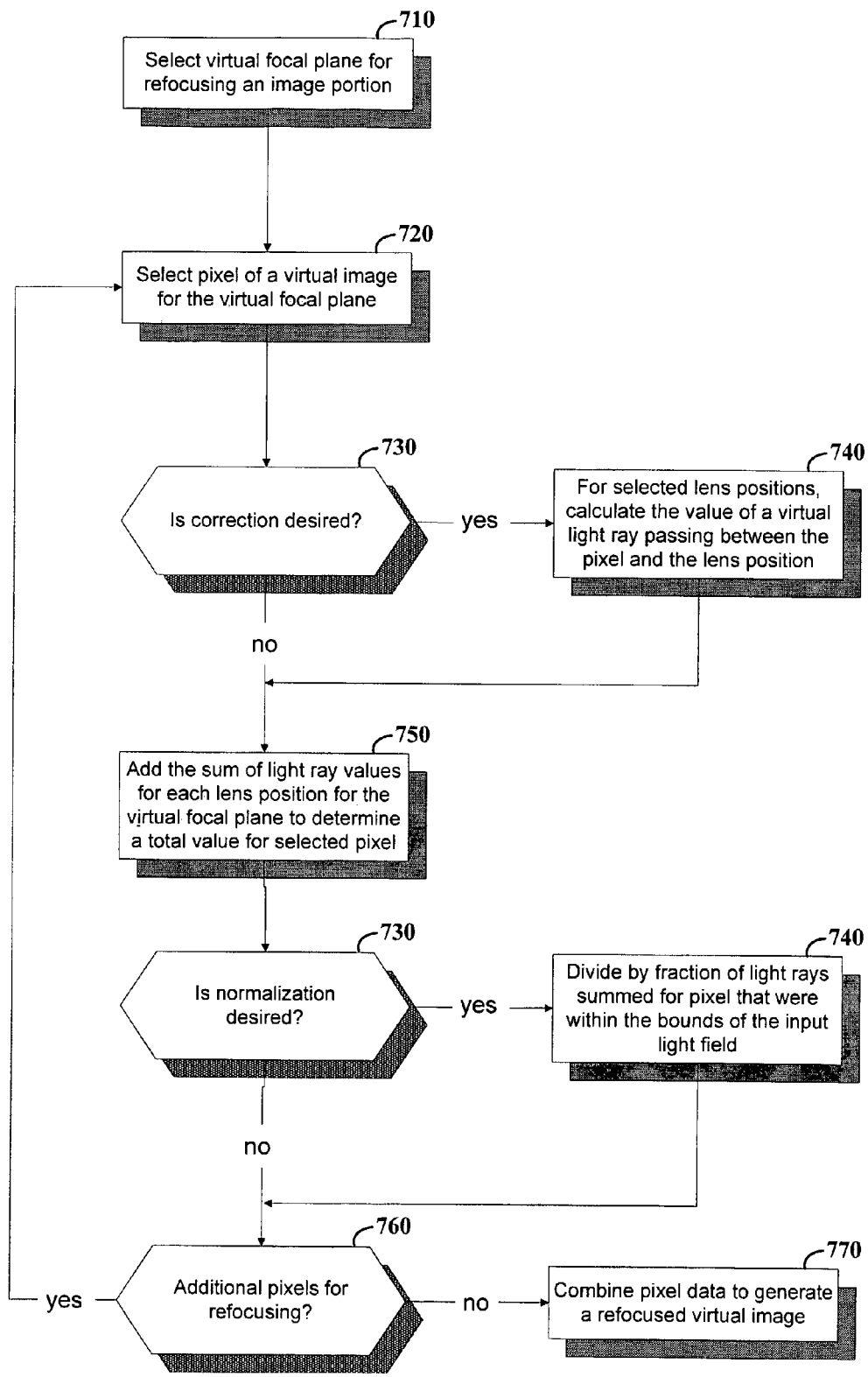
FIG. 7 is a process flow diagram for image refocusing, according to another example embodiment of the present invention.

FIG. 7A is a process flow diagram for image refocusing with a lens arrangement, according to another example embodiment of the present invention. The approach shown in FIG. 7 and discussed below may be implemented, for example, in connection with the refocusing of image data at block 630 in FIG. 6.

At block 710, a virtual focal plane for refocusing an image portion is selected. At block 720, a pixel of a virtual image for the virtual focal plane is selected. If correction (e.g., for lens aberration) is desired at block 730, the value of a virtual light ray (or virtual set of light rays) passing between the selected pixel and each particular lens position is calculated at block 740. In one application, this calculation is facilitated by computing the conjugate light ray that would fall upon the selected pixel and tracing that ray through the path in the lens arrangement.

At block 750, the sum of light ray (or virtual set of light ray) values for each lens position for the particular focal plane are added to determine a total value for the selected pixel. In some applications, the sum added at block 750 is a weighted sum, wherein certain light rays (or set of light rays) are given greater weight than others. If there are additional pixels for refocusing at block 760, another pixel is selected at block 720 and the process continues until no further pixels are desirably refocused. After the pixels have been refocused, the pixel data is combined at block 770 to generate a refocused virtual image at the virtual focal plane selected in block 710. The refocusing approaches involving some or all of blocks 720, 730, 740 and 750 in FIG. 7 are carried out via more specific functions for a variety of applications.

The sensor data processing circuitry implemented with one or more example embodiments described herein includes one or more microprocessors, Application-Specific Integrated Circuits (ASICs), digital signal processors (DSPs), and/or programmable gate arrays (for example, field-programmable gate arrays (FPGAs)), depending upon the implementation. In this regard, sensor data processing circuitry may be any type or form of circuitry whether now known or later developed. For example, the sensor data processing circuitry may include a single component or a multiplicity of components (microprocessors, ASICs and DSPs), either active and/or passive, which are coupled together to implement, provide and/or perform a desired operation/function/application.

In various applications, the sensor data processing circuitry performs or executes one or more applications, routines, programs and/or data structures that implement particular methods, tasks or operations described and/or illustrated herein. The functionality of the applications, routines or programs are selectively combined or distributed in certain applications. In some applications, the applications, routines or programs are implemented by sensor (or other) data processing circuitry using one or more of a variety of programming languages, whether now known or later developed. Such programming languages include, for example, FORTRAN, C, C++, Java and BASIC, whether compiled or uncompiled code, selectively implemented in connection with one or more aspects of the present invention.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. For instance, such changes may include implementing the various optical imaging applications and devices in different types of applications, increasing or decreasing the number of rays collected per pixel (or other selected image area), or implementing different algorithms and/or equations than the examples described to assemble or otherwise process image data. Other changes may involve using coordinate representations other than or in addition to Cartesian coordinates, such as polar coordinates. Such modifications and changes do not depart from the true spirit and scope of the present invention.

What is claimed is:

1. A digital imaging system for generating a virtual image of a scene, wherein the virtual image includes a plurality of pixels, the system comprising:
   a photosensor array, having a plurality of photosensors, configured to detect light including a plurality of light rays from the scene, wherein each photosensor, in response to detecting the light incident thereon, generates light data, the photosensor array further configured to detect a set of the plurality of light rays that concurrently arrive at the particular portion of the physical focal plane at different angles of incidence;
   an optics arrangement, having a physical focus, configured to direct light rays from the scene to the photosensor array via a physical focal plane; and
   processing circuitry to compute a pixel value of each pixel of the virtual image by combining light data from selected photosensors based on angles of incidence of the light rays detected by each photosensor, as characterized by the location of each photosensor relative to the physical focal plane, the virtual image having a virtual focus and a virtual focal plane that are respectively different from the physical focus and the physical focal plane, wherein the virtual focal plane comprises one of a planar focal plane and a non-planar focal plane, wherein the processing circuitry further determines the angles of incidence of light upon each photosensor using a position of each photosensor relative to the microlens, wherein the processing circuitry is configured to combine the light data from selected photosensors based on data indicative of a virtual focal plane that is tilted relative to the physical focal plane and the angles of incidence of the light rays detected by each photosensor, to generate a virtual image of the scene having a virtual focus at the virtual focal plane.

2. A digital imaging system for generating a virtual image of a scene, wherein the virtual image includes a plurality of pixels, the system comprising:
a photosensor array, having a plurality of photosensors, configured to detect light including a plurality of light rays from the scene, wherein each photosensor, in response to detecting the light incident thereon, generates light data, the photosensor array further configured to detect a set of the plurality of light rays that concurrently arrive at the particular portion of the physical focal plane at different angles of incidence;
an optics arrangement, having a physical focus, configured to direct light rays from the scene to the photosensor array via a physical focal plane; and
processing circuitry to compute a pixel value of each pixel of the virtual image by combining light data from selected photosensors based on angles of incidence of the light rays detected by each photosensor, as characterized by the location of each photosensor relative to the physical focal plane, the virtual image having a virtual focus and a virtual focal plane that are respectively different from the physical focus and the physical focal plane, wherein the virtual focal plane comprises one of a planar focal plane and a non-planar focal plane, wherein the processing circuitry further determines the angles of incidence of light upon each photosensor using a position of each photosensor relative to the microlens, wherein the processing circuitry is configured to combine the light data from selected photosensors based on data indicative of a non-planar virtual focal plane and the angles of incidence of the light rays detected by each photosensor, to generate a virtual image of the scene having a virtual focus at the virtual focal plane.

3. A digital imaging system for generating a virtual image of a scene, the system comprising:
optics, having a physical focus, to direct light from the scene onto a physical focal plane, wherein the light includes a set of light rays;
a photosensor array, having a plurality of photosensors, to detect the set of light rays, wherein each photosensor detects different ones of the set of light rays;
a microlens array, disposed between the optics and the photosensor array, and configured to physically direct the set of light rays from the optics to the photosensor array; and
processing circuitry configured to generate a virtual image of the scene using the detected set of light rays by selectively combining data representing the light rays based on directional characteristics of the light rays, wherein the virtual image includes a virtual focus at a virtual focal plane, wherein the virtual focus and the virtual focal plane are different from the physical focus and the physical focal plane, respectively.

4. The system of claim 3, wherein the data processor computes an image by selectively combining selected light rays to virtually redirect the set of light rays.

5. The system of claim 3, wherein the data processor computes an image by selectively adding selected light rays to virtually redirect the set of light rays.

6. The system of claim 3, wherein the processing circuitry is configured to selectively combine data representing the light rays by selectively weighting and adding data representing light rays to virtually redirect the set of light rays.

7. The system of claim 3, wherein the data processor computes an image by virtually redirecting the set of light rays based on a spatial distribution of the set of light rays on the photosensor array and based on the physical direction of the set of light rays from the main lens and through the microlens array to the photosensor array.

8. The digital imaging system of claim 3, wherein the data processor virtually redirects the set of light rays to refocus a portion of the image at a focal plane different from a plane in which the microlens array is located.

9. The digital imaging system of claim 3, wherein the data processor virtually redirects the set of light rays to correct for a lens-aberration.

10. The digital imaging system of claim 3, wherein the data processor virtually redirects the set of light rays to extend the depth of field of the synthesized image.

11. The digital imaging system of claim 3, wherein the photosensor array includes, for each microlens in the microlens array, a plurality of photosensors.

12. The digital imaging system of claim 3, wherein each microlens in the microlens array is configured to diverge light rays focused thereupon by the main lens and to direct the diverged light rays to a plurality of photosensors for the microlens.

13. The digital imaging system of claim 3, wherein the processing circuitry is configured to selectively combine data from the photosensor array to create focused sub-images from different portions of a scene.

14. The digital imaging system of claim 13, wherein the processing circuitry is configured to generate a final image by combining the focused sub-images.

15. The system of claim 3, wherein the microlens array includes a plurality of microlenses, each microlens being associated with a plurality of the photosensors and configured and arranged to direct light from the optics onto the plurality of the photosensors associated with the microlens.

16. The system of claim 3, wherein the processing circuitry is configured to generate a virtual image of the scene by selectively combining data representing the light rays based on data indicative of a virtual focal plane and directional characteristics of the light rays.

17. The system of claim 3, wherein the processing circuitry is configured to generate a virtual image of the scene by selectively combing data representing the light rays based on data indicative if a virtual focal plane and directional characteristics of the light rays incident on the physical plane, the virtual focal plane being tilted relative to the physical focal plane.

18. The system of claim 3, wherein the processing circuitry is configured to generate a virtual image of the scene by combining data representing the light rays based on data indicative of a virtual non-planar focal plane and directional characteristics of the light rays incident on the physical focal plane.

19. The system of claim 3, wherein:
the optics are configured and arranged to project light rays from the scene onto the physical focal plane with a physical depth of field; and,
the processing circuitry is configured to generate a virtual image of the scene having a selected virtual depth of field by selectively combining data representing the light rays based on the selected virtual depth of field and directional characteristics of the light rays incident on the physical focal plane, the selected virtual depth of field being different from the physical depth of field.

20. A method of imaging a scene using a digital imaging device which includes an optics unit and a light ray sensor, the method comprising:
- with the digital imaging device, focusing light from the scene upon a physical focal plane;
- with the digital imaging device, detecting light from the scene which is incident on the physical focal plane;
- using processing circuitry to determine directional characteristics of the detected light;
- using processing circuitry to determine light rays corresponding to the detected light using the directional characteristics of the detected light; and
- using processing circuitry to generate a virtual image of the scene having a virtual focus at a virtual focal plane using the detected light by combining selected light rays based on the directional characteristics of the light, wherein the virtual focus and the virtual focal plane are different from the physical focus and physical focal plane, respectively.

21. The method of claim 20 further including,
- using processing circuitry to select a virtual focal plane; and
- using processing circuitry to generate the virtual image of the scene by combining selected light rays based on the selected virtual focal plane to provide the virtual image of the scene having the virtual focus at the virtual focal plane.

22. The method of claim 20 further including:
- using processing circuitry to select a virtual focal plane wherein the virtual focal plane is tilted relative to the physical focal plane; and
- using processing circuitry to generate the virtual image of the scene by combining the selected light rays based on the selected virtual focal plane to provide the virtual image of the scene having the virtual focus at the virtual focal plane.

23. The method of claim 20 further including:
- using processing circuitry to select a virtual focal plane wherein the virtual focal plane is non-planar; and
- using processing circuitry to generate the virtual image of the scene by combining the selected light rays based on the selected virtual focal plane to provide the virtual image of the scene having the virtual focus at the virtual focal plane.

24. The method of claim 20 further including:
- physically focusing light from the scene upon the physical focal plane to provide a physical depth of field, comprising,
  - using processing circuitry to select a virtual depth of field, wherein the virtual depth of field is different from the physical depth of field; and
  - using processing circuitry to generate the virtual image of the scene by combining the selected light rays based on the selected virtual depth of field to provide the virtual image of the scene having the virtual depth of field.

25. The method of claim 24 wherein the virtual depth of field is greater than the physical depth of field.

* * * * *